(12) United States Patent
Widmer

(10) Patent No.: US 6,876,315 B1
(45) Date of Patent: Apr. 5, 2005

(54) DC-BALANCED 6B/8B TRANSMISSION CODE WITH LOCAL PARITY

(75) Inventor: Albert X. Widmer, Katonah, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/799,054

(22) Filed: Mar. 12, 2004

(51) Int. Cl.[7] .............................................. H03M 5/00
(52) U.S. Cl. ........................................ 341/58; 341/59
(58) Field of Search .................................... 341/58–59

(56) References Cited

U.S. PATENT DOCUMENTS

| | | | | |
|---|---|---|---|---|
| 4,486,739 A | * | 12/1984 | Franaszek et al. | 341/59 |
| 5,304,996 A | * | 4/1994 | Hsu et al. | 341/95 |
| 5,387,911 A | * | 2/1995 | Gleichert et al. | 341/95 |
| 5,606,317 A | * | 2/1997 | Cloonan et al. | 341/58 |
| 5,699,062 A | | 12/1997 | Widmer | 341/58 |
| 5,740,186 A | | 4/1998 | Widmer | 371/37.1 |

* cited by examiner

Primary Examiner—Michael Tokar
Assistant Examiner—Khai M Nguyen
(74) Attorney, Agent, or Firm—Ryan, Mason & Lewis, LLP; Thu Ann Dang, Esq.

(57) ABSTRACT

A transmission code which packs six bits of data and four control vectors into an eight-bit format is presented. A direct current (DC)-balanced 6B/8B transmission code is produced from an input data stream that includes one or more six-bit source vectors. A given coded vector is created in accordance with an eight binary digit coded vector set. The given coded vector has eight binary digits and the given coded vector corresponds to a given six-bit source vector. Each coded vector in the eight binary digit coded vector set is balanced. The given coded vector is output.

29 Claims, 10 Drawing Sheets

20 Encoded Vectors of FIG. 4 with individual Bit Changes

| Name | K FEDCBA | Name | hgfedcba | Name | K FEDCBA | Name | hgfedcba |
|------|----------|------|----------|------|----------|------|----------|
| D00  | 0 000000 | D131 | 01011001 | D77  | 0 111111 | D146 | 01100110 |
| D01  | 0 000001 | D161 | 01110001 | D76  | 0 111110 | D116 | 01001110 |
| D02  | 0 000010 | D162 | 01110010 | D75  | 0 111101 | D115 | 01001101 |
| D04  | 0 000100 | D145 | 01100101 | D73  | 0 111011 | D132 | 01011010 |
| D10  | 0 001000 | D151 | 01101001 | D67  | 0 110111 | D126 | 01010110 |
| D20  | 0 010000 | D123 | 01010011 | D57  | 0 101111 | D154 | 01101100 |
| D40  | 0 100000 | D143 | 01100011 | D37  | 0 011111 | D134 | 01011100 |
| D60  | 0 110000 | D164 | 01110100 | D17  | 0 001111 | D113 | 01001011 |
| K07  | 1 000111 | K107 | 01000111 | K70  | 1 111000 | K170 | 01111000 |
| K25  | 1 010101 | K125 | 01010101 | K52  | 1 101010 | K152 | 01101010 |

48 Encoded Vectors with no Changes

| FIG. 3 | | FIG. 5 | | FIG. 6 | |
|---|---|---|---|---|---|
| Name | h g f e d c b a | Name | h g f e d c b a | Name | h g f e d c b a |
| D207 | 1 0 0 0 0 1 1 1 | D027 | 0 0 0 1 0 1 1 1 | D303 | 1 1 0 0 0 0 1 1 |
| D213 | 1 0 0 0 1 0 1 1 | D033 | 0 0 0 1 1 0 1 1 | D305 | 1 1 0 0 0 1 0 1 |
| D215 | 1 0 0 0 1 1 0 1 | D035 | 0 0 0 1 1 1 0 1 | D306 | 1 1 0 0 0 1 1 0 |
| D216 | 1 0 0 0 1 1 1 0 | D036 | 0 0 0 1 1 1 1 0 | D311 | 1 1 0 0 1 0 0 1 |
| D223 | 1 0 0 1 0 0 1 1 | D047 | 0 0 1 0 0 1 1 1 | D312 | 1 1 0 0 1 0 1 0 |
| D225 | 1 0 0 1 0 1 0 1 | D053 | 0 0 1 0 1 0 1 1 | D314 | 1 1 0 0 1 1 0 0 |
| D226 | 1 0 0 1 0 1 1 0 | D055 | 0 0 1 0 1 1 0 1 | D321 | 1 1 0 1 0 0 0 1 |
| D231 | 1 0 0 1 1 0 0 1 | D056 | 0 0 1 0 1 1 1 0 | D322 | 1 1 0 1 0 0 1 0 |
| D232 | 1 0 0 1 1 0 1 0 | D063 | 0 0 1 1 0 0 1 1 | D324 | 1 1 0 1 0 1 0 0 |
| D234 | 1 0 0 1 1 1 0 0 | D065 | 0 0 1 1 0 1 0 1 | D330 | 1 1 0 1 1 0 0 0 |
| D243 | 1 0 1 0 0 0 1 1 | D066 | 0 0 1 1 0 1 1 0 | D341 | 1 1 1 0 0 0 0 1 |
| D245 | 1 0 1 0 0 1 0 1 | D071 | 0 0 1 1 1 0 0 1 | D342 | 1 1 1 0 0 0 1 0 |
| D246 | 1 0 1 0 0 1 1 0 | D072 | 0 0 1 1 1 0 1 0 | D344 | 1 1 1 0 0 1 0 0 |
| D251 | 1 0 1 0 1 0 0 1 | D074 | 0 0 1 1 1 1 0 0 | D350 | 1 1 1 0 1 0 0 0 |
| D252 | 1 0 1 0 1 0 1 0 | | | | |
| D254 | 1 0 1 0 1 1 0 0 | | | | |
| D261 | 1 0 1 1 0 0 0 1 | | | | |
| D262 | 1 0 1 1 0 0 1 0 | | | | |
| D264 | 1 0 1 1 0 1 0 0 | | | | |
| D270 | 1 0 1 1 1 0 0 0 | | | | |

FIG. 7

20 Encoded Vectors of FIG. 4 with individual Bit Changes

| Name | K FEDCBA | Name | h g f e d c b a | Name | K FEDCBA | Name | h g f e d c b a |
|---|---|---|---|---|---|---|---|
| D00 | 0 000000 | D131 | 0 1 0 1 1 0 0 1 | D77 | 0 111111 | D146 | 0 1 1 0 0 1 1 0 |
| D01 | 0 000001 | D161 | 0 1 1 1 0 0 0 1 | D76 | 0 111110 | D116 | 0 1 0 0 1 1 1 0 |
| D02 | 0 000010 | D162 | 0 1 1 1 0 0 1 0 | D75 | 0 111101 | D115 | 0 1 0 0 1 1 0 1 |
| D04 | 0 000100 | D145 | 0 1 1 0 0 1 0 1 | D73 | 0 111011 | D132 | 0 1 0 1 1 0 1 0 |
| D10 | 0 001000 | D151 | 0 1 1 0 1 0 0 1 | D67 | 0 110111 | D126 | 0 1 0 1 0 1 1 0 |
| D20 | 0 010000 | D123 | 0 1 0 1 0 0 1 1 | D57 | 0 101111 | D154 | 0 1 1 0 1 1 0 0 |
| D40 | 0 100000 | D143 | 0 1 1 0 0 0 1 1 | D37 | 0 011111 | D134 | 0 1 0 1 1 1 0 0 |
| D60 | 0 110000 | D164 | 0 1 1 1 0 1 0 0 | D17 | 0 001111 | D113 | 0 1 0 0 1 0 1 1 |
| K07 | 1 000111 | K107 | 0 1 0 0 0 1 1 1 | K70 | 1 111000 | K170 | 0 1 1 1 1 0 0 0 |
| K25 | 1 010101 | K125 | 0 1 0 1 0 1 0 1 | K52 | 1 101010 | K152 | 0 1 1 0 1 0 1 0 |

FIG. 8

6B/8B Code

| Name | K FEDCBA | Name | hgfedcba | Name | K FEDCBA | Name | hgfedcba |
|---|---|---|---|---|---|---|---|
| D00 | 0 000000 | D131 | 01011001 | D42 | 0 100010 | D342 | 11100010 |
| D01 | 0 000001 | D161 | 01110001 | D43 | 0 100011 | D243 | 10100011 |
| D02 | 0 000010 | D162 | 01110010 | D44 | 0 100100 | D344 | 11100100 |
| D03 | 0 000011 | D303 | 11000011 | D45 | 0 100101 | D245 | 10100101 |
| D04 | 0 000100 | D145 | 01100101 | D46 | 0 100110 | D246 | 10100110 |
| D05 | 0 000101 | D305 | 11000101 | D47 | 0 100111 | D047 | 00100111 |
| D06 | 0 000110 | D306 | 11000110 | D50 | 0 101000 | D350 | 11101000 |
| D07 | 0 000111 | D207 | 10000111 | D51 | 0 101001 | D251 | 10101001 |
| D10 | 0 001000 | D151 | 01101001 | D52 | 0 101010 | D252 | 10101010 |
| D11 | 0 001001 | D311 | 11001001 | D53 | 0 101011 | D053 | 00101011 |
| D12 | 0 001010 | D312 | 11001010 | D54 | 0 101100 | D254 | 10101100 |
| D13 | 0 001011 | D213 | 10001011 | D55 | 0 101101 | D055 | 00101101 |
| D14 | 0 001100 | D314 | 11001100 | D56 | 0 101110 | D056 | 00101110 |
| D15 | 0 001101 | D215 | 10001101 | D57 | 0 101111 | D154 | 01101100 |
| D16 | 0 001110 | D216 | 10001110 | D60 | 0 110000 | D164 | 01110100 |
| D17 | 0 001111 | D113 | 01001011 | D61 | 0 110001 | D261 | 10110001 |
| D20 | 0 010000 | D123 | 01010011 | D62 | 0 110010 | D262 | 10110010 |
| D21 | 0 010001 | D321 | 11010001 | D63 | 0 110011 | D063 | 00110011 |
| D22 | 0 010010 | D322 | 11010010 | D64 | 0 110100 | D264 | 10110100 |
| D23 | 0 010011 | D223 | 10010011 | D65 | 0 110101 | D065 | 00110101 |
| D24 | 0 010100 | D324 | 11010100 | D66 | 0 110110 | D066 | 00110110 |
| D25 | 0 010101 | D225 | 10010101 | D67 | 0 110111 | D126 | 01010110 |
| D26 | 0 010110 | D226 | 10010110 | D70 | 0 111000 | D270 | 10111000 |
| D27 | 0 010111 | D027 | 00010111 | D71 | 0 111001 | D071 | 00111001 |
| D30 | 0 011000 | D330 | 11011000 | D72 | 0 111010 | D072 | 00111010 |
| D31 | 0 011001 | D231 | 10011001 | D73 | 0 111011 | D132 | 01011010 |
| D32 | 0 011010 | D232 | 10011010 | D74 | 0 111100 | D074 | 00111100 |
| D33 | 0 011011 | D033 | 00011011 | D75 | 0 111101 | D115 | 01001101 |
| D34 | 0 011100 | D234 | 10011100 | D76 | 0 111110 | D116 | 01001110 |
| D35 | 0 011101 | D035 | 00011101 | D77 | 0 111111 | D146 | 01100110 |
| D36 | 0 011110 | D036 | 00011110 | K07 | 1 000111 | K107 | 01000111 |
| D37 | 0 011111 | D134 | 01011100 | K25 | 1 010101 | K125 | 01010101 |
| D40 | 0 100000 | D143 | 01100011 | K52 | 1 101010 | K152 | 01101010 |
| D41 | 0 100001 | D341 | 11100001 | K70 | 1 111000 | K170 | 01111000 |

FIG. 9 a-bit Encoding

| Name | K FEDCBA | Coding Label | a | Name | K FEDCBA | Coding Label | a |
|---|---|---|---|---|---|---|---|
| D00 | x 00000$\bar{0}$ | $\bar{A'} \cdot B' \cdot C' \cdot D' \cdot E' \cdot F'$ | 1 | D77 | x 11111$\bar{1}$ | $\bar{A} \cdot B \cdot C \cdot D \cdot E \cdot F$ | 0 |
| D04 | x 00010$\bar{0}$ | $\bar{A'} \cdot B' \cdot E' \cdot F' \cdot C \neq D$ | 1 | D73 | x 11101$\bar{1}$ | $\bar{A} \cdot B \cdot E \cdot F \cdot C \neq D$ | 0 |
| D10 | x 00100$\bar{0}$ | $\bar{A'} \cdot B' \cdot E' \cdot F' \cdot C \neq D$ | 1 | D67 | x 11011$\bar{1}$ | $\bar{A} \cdot B \cdot E \cdot F \cdot C \neq D$ | 0 |
| D20 | x 01000$\bar{0}$ | $\bar{A'} \cdot B' \cdot C' \cdot D' \cdot E \neq F$ | 1 | D57 | x 10111$\bar{1}$ | $\bar{A} \cdot B \cdot C \cdot D \cdot E \neq F$ | 0 |
| D40 | x 10000$\bar{0}$ | $\bar{A'} \cdot B' \cdot C' \cdot D' \cdot E \neq F$ | 1 | D37 | x 01111$\bar{1}$ | $\bar{A} \cdot B \cdot C \cdot D \cdot E \neq F$ | 0 |

FIG. 10A b-bit Encoding

| Name | K FEDCBA | Coding Label | b | Name | K FEDCBA | Coding Label | b |
|---|---|---|---|---|---|---|---|
| D20 | x 010$\bar{0}\bar{0}$0 | $A' \cdot \bar{B'} \cdot C' \cdot D' \cdot E \neq F$ | 1 | D57 | x 1011$\bar{1}$1 | $A \cdot \bar{B} \cdot C \cdot D \cdot E \neq F$ | 0 |
| D40 | x 100$\bar{0}\bar{0}$0 | $A' \cdot \bar{B'} \cdot C' \cdot D' \cdot E \neq F$ | 1 | D37 | x 0111$\bar{1}$1 | $A \cdot \bar{B} \cdot C \cdot D \cdot E \neq F$ | 0 |

FIG. 10B c-bit Encoding

| Name | K FEDCBA | Coding Label | c | Name | K FEDCBA | Coding Label | c |
|---|---|---|---|---|---|---|---|
| D60 | x 110$\bar{0}\bar{0}$0 | $A' \cdot B' \cdot D' \cdot E \cdot F$ | 1 | D17 | x 001$\bar{1}\bar{1}$1 | $A \cdot B \cdot D \cdot E' \cdot F'$ | 0 |

FIG. 10C d-bit Encoding

| Name | K FEDCBA | Coding Label | d | Name | K FEDCBA | Coding Label | d |
|---|---|---|---|---|---|---|---|
| D00 | x 00$\bar{0}$000 | $A' \cdot B' \cdot C' \cdot \bar{D'} \cdot E' \cdot F'$ | 1 | D77 | x 11$\bar{1}$111 | $A \cdot B \cdot C \cdot \bar{D} \cdot E \cdot F$ | 0 |

FIG. 10D e-bit Encoding

| Name | K FEDCBA | Coding Label | e | Name | K FEDCBA | Coding Label | e |
|---|---|---|---|---|---|---|---|
| D00 | x 0$\bar{0}$0000 | $A' \cdot B' \cdot C' \cdot D' \cdot \bar{E'} \cdot F'$ | 1 | D77 | x 111111 | $A \cdot B \cdot C \cdot D \cdot \bar{E} \cdot F$ | 0 |
| D01 | x 0$\bar{0}$0001 | $C' \cdot D' \cdot \bar{E'} \cdot F' \cdot A \neq B$ | 1 | D76 | x 1$\bar{1}$1110 | $C \cdot D \cdot \bar{E} \cdot F \cdot A \neq B$ | 0 |
| D02 | x 0$\bar{0}$0010 | $C' \cdot D' \cdot \bar{E'} \cdot F' \cdot A \neq B$ | 1 | D75 | x 1$\bar{1}$1101 | $C \cdot D \cdot \bar{E} \cdot F \cdot A \neq B$ | 0 |

FIG. 10E f-bit Encoding

| Name | K FEDCBA | Coding Label | f | Name | K FEDCBA | Coding Label | f |
|---|---|---|---|---|---|---|---|
| D01 | x $\overline{0}$00001 | C'·D'·E'·$\overline{F'}$·A≠B | 1 | D76 | x $\overline{1}$11110 | C·D·E·$\overline{F}$·A≠B | 0 |
| D02 | x $\overline{0}$00010 | C'·D'·E'·$\overline{F'}$·A≠B | 1 | D75 | x $\overline{1}$11101 | C·D·E·$\overline{F}$·A≠B | 0 |
| D04 | x $\overline{0}$00100 | A'·B'·E'·$\overline{F'}$·C≠D | 1 | D73 | x $\overline{1}$11011 | A·B·E·$\overline{F}$·C≠D | 0 |
| D10 | x $\overline{0}$01000 | A'·B'·E'·$\overline{F'}$·C≠D | 1 | D67 | x $\overline{1}$10111 | A·B·E·$\overline{F}$·C≠D | 0 |

FIG. 10F g-bit Encoding

| Name | K FEDCBA | Coding Label | g | Name | K FEDCBA | Coding Label | g |
|---|---|---|---|---|---|---|---|
| D00 | x 000000 | A'·B'·C'·(D'+E'+F') | 1 | *D00 | x 000000 | (A'+B'+C')·D'·E'·F' | 1 |
| D10 | x 001000 | A'·B'·C'·(D'+E'+F') | 1 | D01 | x 000001 | (A'+B'+C')·D'·E'·F' | 1 |
| D20 | x 010000 | A'·B'·C'·(D'+E'+F') | 1 | D02 | x 000010 | (A'+B'+C')·D'·E'·F' | 1 |
| D30 | x 011000 | A'·B'·C'·(D'+E'+F') | 1 | D03 | x 000011 | (A'+B'+C')·D'·E'·F' | 1 |
| D40 | x 100000 | A'·B'·C'·(D'+E'+F') | 1 | D04 | x 000100 | (A'+B'+C')·D'·E'·F' | 1 |
| D50 | x 101000 | A'·B'·C'·(D'+E'+F') | 1 | D05 | x 000101 | (A'+B'+C')·D'·E'·F' | 1 |
| D60 | x 110000 | A'·B'·C'·(D'+E'+F') | 1 | D06 | x 000110 | (A'+B'+C')·D'·E'·F' | 1 |
| D11 | x 001001 | (A'·B'+A'·C'+B'·C')·E'·F' | 1 | D17 | x 001111 | A·B·C·D | 1 |
| D12 | x 001010 | (A'·B'+A'·C'+B'·C')·E'·F' | 1 | D37 | x 011111 | A·B·C·D | 1 |
| D14 | x 001100 | (A'·B'+A'·C'+B'·C')·E'·F' | 1 | D57 | x 101111 | A·B·C·D | 1 |
| D21 | x 010001 | (A'·B'+A'·C'+B'·C')·D'·F' | 1 | D77 | x 111111 | A·B·C·D | 1 |
| D22 | x 010010 | (A'·B'+A'·C'+B'·C')·D'·F' | 1 | D75 | x 111101 | C·D·E·F·A≠B | 1 |
| D24 | x 010100 | (A'·B'+A'·C'+B'·C')·D'·F' | 1 | D76 | x 111110 | C·D·E·F·A≠B | 1 |
| D41 | x 100001 | (A'·B'+A'·C'+B'·C')·D'·E' | 1 | D67 | x 110111 | A·B·E·F·C≠D | 1 |
| D42 | x 100010 | (A'·B'+A'·C'+B'·C')·D'·E' | 1 | D73 | x 111011 | A·B·E·F·C≠D | 1 |
| D44 | x 100100 | (A'·B'+A'·C'+B'·C')·D'·E' | 1 | K07 | 1 000111 | K | 1 |
| *D00 | x 000000 |  | 1 | K25 | 1 010101 | K | 1 |
| *D01 | x 000001 |  | 1 | K52 | 1 101010 | K | 1 |
| *D02 | x 000010 |  | 1 | K70 | 1 111000 | K | 1 |
| *D04 | x 000100 |  | 1 |  |  |  |  |
| *D10 | x 001000 |  | 1 |  |  |  |  |
| *D20 | x 010000 |  | 1 |  |  |  |  |
| *D40 | x 100000 |  | 1 |  |  |  |  |

FIG. 10G h-bit Encoding

| Name | K FEDCBA | Coding Label | h | Name | K FEDCBA | Coding Label | h |
|---|---|---|---|---|---|---|---|
| D17 | x 001111 | A·B·C·(D+E+F) | 0 | D71 | x 111001 | (A+B+C)·D·E·F | 0 |
| D27 | x 010111 | A·B·C·(D+E+F) | 0 | D72 | x 111010 | (A+B+C)·D·E·F | 0 |
| D37 | x 011111 | A·B·C·(D+E+F) | 0 | D73 | x 111011 | (A+B+C)·D·E·F | 0 |
| D47 | x 100111 | A·B·C·(D+E+F) | 0 | D74 | x 111100 | (A+B+C)·D·E·F | 0 |
| D57 | x 101111 | A·B·C·(D+E+F) | 0 | D75 | x 111101 | (A+B+C)·D·E·F | 0 |
| D67 | x 110111 | A·B·C·(D+E+F) | 0 | D76 | x 111110 | (A+B+C)·D·E·F | 0 |
| D77 | x 111111 | A·B·C·(D+E+F) | 0 | *D77 | x 111111 | (A+B+C)·D·E·F | 0 |
| D33 | x 011011 | (A·B+A·C+B·C)·D·E | 0 | D00 | x 000000 | A'·B'·C'·D' | 0 |
| D35 | x 011101 | (A·B+A·C+B·C)·D·E | 0 | D20 | x 010000 | A'·B'·C'·D' | 0 |
| D36 | x 011110 | (A·B+A·C+B·C)·D·E | 0 | D40 | x 100000 | A'·B'·C'·D' | 0 |
| D53 | x 101011 | (A·B+A·C+B·C)·D·F | 0 | D60 | x 110000 | A'·B'·C'·D' | 0 |
| D55 | x 101101 | (A·B+A·C+B·C)·D·F | 0 | D01 | x 000001 | C'·D'·E'·F'·A≠B | 0 |
| D56 | x 101110 | (A·B+A·C+B·C)·D·F | 0 | D02 | x 000010 | C'·D'·E'·F'·A≠B | 0 |
| D63 | x 110011 | (A·B+A·C+B·C)·E·F | 0 | D04 | x 000100 | A'·B'·E'·F'·C≠D | 0 |
| D65 | x 110101 | (A·B+A·C+B·C)·E·F | 0 | D10 | x 001000 | A'·B'·E'·F'·C≠D | 0 |
| D66 | x 110110 | (A·B+A·C+B·C)·E·F | 0 | K07 | 1 000111 | K | 0 |
| *D37 | x 011111 | | 0 | K25 | 1 010101 | K | 0 |
| *D57 | x 101111 | | 0 | K52 | 1 101010 | K | 0 |
| *D67 | x 110111 | | | K70 | 1 111000 | K | 0 |
| *D73 | x 111011 | | | | | | |
| *D75 | x 111101 | | | | | | |
| *D76 | x 111110 | | | | | | |
| *D77 | x 111111 | | | | | | |

FIG. 10H

A-bit Decoding

| Name | hgfedcba | Coding Label | AK | Name | hgfedcba | Coding Label | AK |
|---|---|---|---|---|---|---|---|
| D131 | 01011001̄ | ā·b'·c'·d·e·f'·g·h' | 00 | D146 | 01100110̄ | a'·b·c·d'·e'·f·g·h' | 10 |
| D145 | 01100101̄ | ā·b'·e'·f·g·h'·c≠d | 00 | D132 | 01011010̄ | a'·b·e·f'·g·h'·c≠d | 10 |
| D151 | 01101001̄ | ā·b'·e'·f·g·h'·c≠d | 00 | D126 | 01010110̄ | a'·b·e·f'·g·h'·c≠d | 10 |
| D123 | 01010011̄ | ā·b·c'·d'·g·h'·e≠f | 00 | D154 | 01101100̄ | a'·b'·c·d·g·h'·e≠f | 10 |
| D143 | 01100011̄ | ā·b·c'·d'·g·h'·e≠f | 00 | D134 | 01011100̄ | a'·b'·c·d·g·h'·e≠f | 10 |

FIG. 12A

B-bit Decoding

| Name | hgfedcba | Coding Label | BK | Name | hgfedcba | Coding Label | BK |
|---|---|---|---|---|---|---|---|
| D123 | 0101001$\overline{1}$ | a·$\overline{b}$·c'·d'·g·h'·e≠f | 00 | D154 | 0110110$\overline{0}$ | a'·$\overline{b'}$·c·d·g·h'·e≠f | 10 |
| D143 | 0110001$\overline{1}$ | a·$\overline{b}$·c'·d'·g·h'·e≠f | 00 | D134 | 0101110$\overline{0}$ | a'·$\overline{b'}$·c·d·g·h'·e≠f | 10 |

FIG. 12B

C-bit Decoding

| Name | hgfedcba | Coding Label | CK | Name | hgfedcba | Coding Label | CK |
|---|---|---|---|---|---|---|---|
| D164 | 011101$\overline{0}$0 | a'·b'·d'·e·f·g·h' | 00 | D113 | 010010$\overline{1}$1 | a·b·d·e'·f'·g·h' | 10 |

FIG. 12C

D-bit Decoding

| Name | hgfedcba | Coding Label | DK | Name | hgfedcba | Coding Label | DK |
|---|---|---|---|---|---|---|---|
| D131 | 01011$\overline{0}$01 | a·b'·c'·$\overline{d}$·e·f'·g·h' | 00 | D146 | 01100$\overline{1}$10 | a'·b·c·$\overline{d'}$·e'·f·g·h' | 10 |

FIG. 12D

E-bit Decoding

| Name | hgfedcba | Coding Label | EK | Name | hgfedcba | Coding Label | EK |
|---|---|---|---|---|---|---|---|
| D131 | 0101$\overline{1}$001 | a·b'·c'·d·$\overline{e}$·f'·g·h' | 00 | D146 | 0110$\overline{0}$110 | a'·b·c·d'·$\overline{e'}$·f·g·h' | 10 |
| D161 | 0111$\overline{0}$001 | c'·d'·$\overline{e}$·f·g·h'·a≠b | 00 | D116 | 0100$\overline{1}$110 | c·d·$\overline{e'}$·f'·g·h'·a≠b | 10 |
| D162 | 0111$\overline{0}$010 | c'·d'·$\overline{e}$·f·g·h'·a≠b | 00 | D115 | 0100$\overline{1}$101 | c·d·$\overline{e'}$·f'·g·h'·a≠b | 10 |

FIG. 12E

F-bit Decoding

| Name | hgfedcba | Coding Label | FK | Name | hgfedcba | Coding Label | FK |
|---|---|---|---|---|---|---|---|
| D161 | 011$\overline{1}$0001 | c'·d'·e·$\overline{f}$·g·h'·a≠b | 00 | D116 | 010$\overline{0}$1110 | c·d·e'·$\overline{f'}$·g·h'·a≠b | 10 |
| D162 | 011$\overline{1}$0010 | c'·d'·e·$\overline{f}$·g·h'·a≠b | 00 | D115 | 010$\overline{0}$1101 | c·d·e'·$\overline{f'}$·g·h'·a≠b | 10 |
| D145 | 011$\overline{0}$0101 | a·b'·e'·$\overline{f}$·g·h'·c≠d | 00 | D132 | 010$\overline{1}$1010 | a'·b·e·$\overline{f'}$·g·h'·c≠d | 10 |
| D151 | 011$\overline{0}$1001 | a·b'·e'·$\overline{f}$·g·h'·c≠d | 00 | D126 | 010$\overline{1}$0110 | a'·b·e·$\overline{f'}$·g·h'·c≠d | 10 |

FIG. 12F

K-bit Decoding

| Name | hgfedcba | Coding Label | K | Name | hgfedcba | Coding Label | K |
|---|---|---|---|---|---|---|---|
| K107 | 01000111 | a·c'·d·f'·g·h'·b≠e | 1 | K170 | 01111000 | a'·c'·d·f·g·h'·b≠e | 1 |
| K125 | 01010101 | a·c'·d·f'·g·h'·b≠e | 1 | K152 | 01101010 | a'·c'·d·f·g·h'·b≠e | 1 |

FIG. 12G

DC-BALANCED 6B/8B TRANSMISSION CODE WITH LOCAL PARITY

FIELD OF THE INVENTION

The present invention relates to communication systems and, more particularly, relates to transmission codes in communication systems.

BACKGROUND OF THE INVENTION

A purpose of transmission codes is to transform the frequency spectrum of a serial data stream so that clocking can be recovered readily and Alternating Current (AC) coupling is possible. Typically, a direct current (DC)-balanced code can be used to provide AC coupling. Transmission codes are also used, often in combination with signal waveform shaping, to adapt the signal spectrum more closely to specific channel requirements.

In order to provide frequency spectrum modification, a transmission code converts data vectors into coded vectors. Typical transmission codes also provide special "control" characters outside a data vector set for functions, such as character synchronization, frame delimiters and perhaps for abort, reset, idle, diagnostics or other functions. During coding, incoming data or control vectors are converted to coded vectors in accordance with encoding rules of the transmission code. During decoding, incoming coded vectors are converted back to data or control vectors in accordance with decoding rules of the transmission code.

Transmission codes are generally combined with other techniques, such as parity or error correcting codes, in order to determine which coded vector or which bit of a coded vector has an error.

Although transmission codes are beneficial, there is still a need for an improved transmission code.

SUMMARY OF THE INVENTION

The present invention provides a direct current (DC)-balanced 6B/8B transmission code having local parity.

In an exemplary embodiment, a DC-balanced 6B/8B transmission code is produced from an input data stream that includes one or more six-bit source vectors. A given coded vector is created in accordance with an eight binary digit coded vector set. The given coded vector has eight binary digits and the given coded vector corresponds to a given six-bit source vector. Each coded vector in the eight binary digit coded vector set is balanced. The given coded vector is output.

A more complete understanding of the present invention, as well as further features and advantages of the present invention, will be obtained by reference to the following detailed description and drawings.

BRIEF DESCRIPTION OF THE DRAWINGS

FIG. 7 is a table showing exemplary coding assignments for the 48 coded vectors having no changes in any of the six source bits during coding;

FIG. 8 is a table showing exemplary coding assignments for the 20 coded vectors having changes in one, two, or three source bits during coding;

FIG. 9 is a table showing exemplary coding assignments for the 6B/8B transmission code of the present invention;

FIGS. 10A through 10H show tables used for encoding six bits of an uncoded vector into a coded vector having eight bits a through h, respectively;

FIGS. 12A through 12G show tables used for decoding an eight bit coded vector into an uncoded vector having bits A through F and a control bit K, respectively;

DETAILED DESCRIPTION OF PREFERRED EMBODIMENTS

Figure 1:
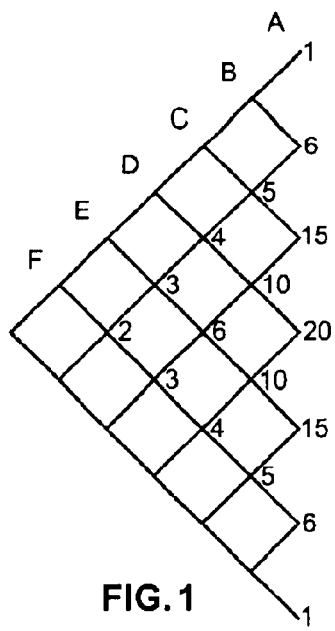
FIG. 1 is a trellis diagram of 64 source vectors of the present invention, ignoring the value of a control input used to create control vectors.

The present invention provides methods and apparatus for encoding and decoding using a 6B/8B transmission code. As is described in more detail below, the 6B/8B transmission code of the present invention provides 68 balanced coded vectors with no leading or trailing runs of four. Any error pattern which does not have an equal number of erroneous ones and erroneous zeros within an 8-bit vector generates an invalid vector. Therefore, the 6B/8B transmission code can be considered to have local parity, since a single bit error or an odd number of bit errors is a subset of the errors detected by the code. Being able to detect a vector having any single bit error or odd number of bit errors is a function usually performed by adding a parity bit to a vector. Put another way, in a code with local parity such as the 6B/8B transmission code described below, each six-bit uncoded vector has a unique coded eight-bit coded vector that corresponds thereto. The coded vectors are designed such that if there is an unbalanced error pattern in a coded vector, the valid coded vector would be converted into an invalid coded vector. In this disclosure, the terms "coded" and "encoded" will be used interchangeably.

Furthermore, because certain errors in a coded vector can be determined, then other relatively simple techniques can be used to determine which bit or bits in the coded vector have an error. As an example, a parity vector computed over a block of coded vectors can be used to correct the error. Examples using parity vectors to correct errors are shown in U.S. Pat. No. 5,740,186, by A. X. Widmer, entitled "Apparatus and Method for Error Correction Based on Transmission Code Violations and Parity" (1998) and U.S. patent application Ser. No. 10/323,502, by A. X. Widmer, entitled "Error Correction with Low Latency for Bus Structures," filed on Dec. 19, 2002, the disclosures of which are hereby incorporated by reference.

For ease of reference, the present disclosure is divided into the following sections: Introduction, General Description of the 6B/8B Transmission Code, Source Vectors and Coded Vectors, Generation of Encoded 8B Vectors, Circuit Implementation of the 6B/8B Encoder, Generation of Decoded 6B Vectors, Validity Checks, Circuit Implementation of the 6B/8B Decoder including the Validity Checks, and Implementation Summary.

A. Introduction

Since the start of the digital age, it has been common practice to append a parity bit to a group of bits such as a byte so that a byte afflicted with a single error could be identified and perhaps corrected by another set of parity bits. For reliable serial transmission, redundancy is often added to control the run length and bandwidth characteristics of the serial bit stream. A run length is the number of ones or zeros in a row, and a "leading run" of three is three one or three zeros in the beginning three bits of an uncoded or coded vector. While transmission codes usually can detect many types of errors in a string of encoded vectors, they usually cannot always point to the exact error location or identify the specific faulty vector. Instead, extra redundancy is typically required to do so. Examples of this approach are U.S. Pat. No. 5,740,186 and U.S. patent application Ser. No. 10/323, 502, the disclosures of which are incorporated by reference above.

The overall coding efficiency can be raised if parity and transmission aspects are solved by a single solution as was done in U.S. Pat. No. 5,699,062, by A. X. Widmer, entitled "Transmission Code having Local Parity" (1997), the disclosure of which is hereby incorporated by reference. For new applications of transmission codes in wide computer buses, compatibility with the eight-bit byte format, such as that described in U.S. Pat. No. 5,699,062, carries less weight. Remainders of a few bits can readily be handled by compatible transmission codes such as 1B/2B, 3B/4B, or 5B/6B. In other situations, where the bus width, n, is a multiple of 6 and 8 such as n×24, it is just the number of coding circuits and perhaps transmission lanes which change.

A new solution is the 6B/8B code which is presented here. The 6B/8B transmission code is implemented with very simple circuits suitable for extremely high operating rates. Short circuit delays are compatible with low latency requirements. Also, the ratio of the serial transmission rate and the parallel electrical interface clocks is a preferred power of two versus a multiple of three or five for solutions based on any of the above references. The simple circuitry also helps to contain power dissipation in a critical area.

While this new 6B/8B transmission code is primarily aimed at applications with statistically independent single errors, such as well designed optical links, the code can also have advantages for applications with no forward error correction where the local parity feature has a subordinate role. With statistically independent single errors, each coded vector having an odd number of errors is easily determined and can be retransmitted.

Additionally, the 6B/8B code provides another design point among several alternatives. As an example, an electrical bus with 72 data lines may be transmitted over nine 8B/10B coded lines. If the distance and baud rate of the electrical lines is aggressive, decision feedback equalizers may be required which have a tendency to generate multiple errors. To overcome this problem, five lines are added carrying an error correction Hamming code. To transport a single 72-bit word with Hamming correction over the 14 high speed lines operating at ten times the bus rate requires then 14×10=140 bits. Using 6B/8B code over 12+5=17 high speed lines operating at eight times the bus rate requires only 17×8=136 bits which is surprising considering the larger overhead of 6B/8B code. The savings result from less overhead for error correction, because of the wider correction entities. The larger number of serial lines can be used to either lower the serial transmission rate to eight times the bus rate rather than 10 times. Alternatively, the bus rate and throughput can be increased by 25 percent assuming, in both cases, an entire 72-bit word is dispatched with each bus-rate clock cycle. For comparison, similar performance can be obtained using the more complex 7B/8B code, which can transmit words of 77 bits with Hamming correction on just 16 lines operating at eight times the bus rate. As another example, the well known 5B/6B code can handle 75-bit words with Hamming correction on 20 lines at a serial rate of just six times the bus rate.

B. General Description of the 6B/8B Transmission Code

In an exemplary embodiment, the input to the encoding apparatus comprises seven lines plus a clock. Six unrestricted lines represent 64 data vectors, as part of an input data stream, if the seventh line, the control line, is not asserted. If the control line is asserted together with one of four specified data vectors, an encoded control vector is generated which is recognizable as other than data. The 6B/8B transmission code is DC-balanced because each coded vector has a disparity of zero. Disparity is the difference between the number of one and zero bits in a defined block of bits, which in this case is the coded 8-bit vector. The term "balanced" refers to a zero disparity for a coded vector.

In the 6B/8B transmission code, there are a total of 68 encoded vectors and the encoded vectors are all balanced. Therefore, any single bit error or any odd number of bit errors in the coded domain will generate an invalid vector instantly recognizable as such.

For purposes of encoding and decoding, the 64 source vectors are classified into four sets:

1. A first set of 20 source vectors comprises all balanced 6B vectors.
2. A second set of 14 source vectors comprises all 6B vectors with a disparity of plus two with the exception of (e.g., not including) the vector with a trailing run of four ones.
3. A third set of 14 source vectors comprises all 6B vectors with a disparity of minus two with the exception of (e.g., not including) the vector with a trailing run of four zeros.
4. A fourth set of 20 source vectors comprises the 14 vectors with a disparity of four or six, the two vectors with a disparity of two and a trailing run of four, and the four control vectors.

In the encoding process, all four sets obtain a two-bit prefix as described in more detail below. Alternatively, the two bits could also be added as a suffix or at other specified positions. However, the prefix is a beneficial implementation for reasons explained below. The source bits of the first three sets remain unchanged for encoding and decoding. Only the 16 data vectors of set four require changes in one, two or three bit positions to generate balanced encoded vectors. The prefix is selected as follows:

1. The first set takes a two-bit prefix with complementary bit-values, i.e., 10, or 01 in an alternate implementation.
2. The second set takes a prefix with a value of 00.
2. The third set takes a prefix with a value of 11.
4. The fourth set takes a two-bit prefix which is the complement of that of the first set, i.e., a value of 01, or 10 in an alternate implementation.

Notation

The six bits of the source vectors are identified by the capital letters A, B, C, D, E, and F. An additional control input carries the label K. The eight bits of the coded vectors are identified by the respective lower case letters a, b, c, d, e, and f; the two extra bits are identified by the letters g and h. In the circuit diagrams described below in reference to FIGS. 11A, 11B, 13A, and 13B, the coded inputs and outputs 'a' through 'h' are prefixed with the capital letter C because some design tools do not differentiate between lower and upper case letters. All vectors are assigned a name starting with the letter D or K for data or control vectors, respectively, followed by a two position octal number for source vectors, or a three position octal number for coded vectors. The octal number represents the binary bit pattern with the low order bit on the right side (i.e., bit A or a). The high order octal position for coded vectors indicates the value of the bits g and h which identify the class to which the coded vector belongs.

The present disclosure assumes that the high order bit h is transmitted first. The 6B/8B transmission code is not sensitive to the order, but because the bits g and h are used to classify the coded vectors, it is conceivable that the positions of the bits g and h at the leading end of coded vectors could be used to slightly reduce the latency of the receiver or to improve the timing margin. Note that a reversal of the transmission order would affect the synchronizing vector pair defined below.

The signal names used in the equations of this document do not reflect any logic levels; instead, the signal names are to be interpreted as abstract logic statements. However, in the circuit diagrams, the signal names may be prefixed with the letter P or N to indicate whether the function is true at the upper or lower level, respectively. The P and N prefixes are normally not used for net names which start with P and N, respectively. Net numbers starting with 'n' or 'm' are true at the lower level and take the P prefix if true at the upper level. In the logic equations, the symbols ·, +, and ⊕ represent the Boolean AND, OR, and EXCLUSIVE OR functions, respectively. The apostrophe (') represents negation.

C. Source Vectors and Coded Vectors

Figure 2:
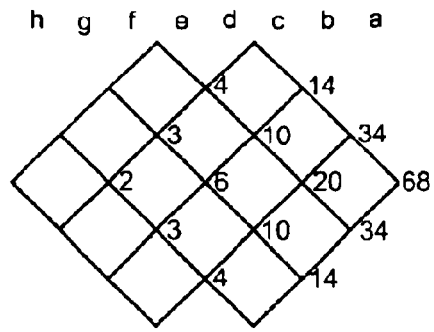
FIG. 2 is a trellis diagram of 68 coded vectors, which include four control vectors.

FIG. 1 is a trellis diagram of the 64 source vectors, ignoring the value of the K-input. FIG. 2 is a trellis diagram of the 68 coded vectors, which include four control vectors which are other than data. The numbers in the diagrams indicate the number of vectors ending with the node to the left of the numbers.

Low Frequency Characteristics

From the trellis of FIG. 2, it is evident that the code is DC-balanced with a maximum digital sum variation of six. The normalized DC-offset, which is related to the area between the zero disparity level and the extreme contour of the trellis, is 1.75. As a point of reference, the offset value is 1.9 for the Fibre Channel 8B/10B code as described in U.S. Pat. No. 4,486,739 by Franaszek and Widmer, entitled "Byte Oriented DC Balanced (0,4) 8B/10B Partitioned Block Transmission Code" (1984), the disclosure of which is hereby incorporated by reference. The low frequency cut-off point for high pass filters can be located as low or below that for 8B/10B code depending on the low pass filter parameters for equal eye closure.

Synchronization Characteristics

In an exemplary embodiment, the maximum run length is six centered across the 8B boundaries. In this exemplary embodiment, there are no contiguous runs of six. Additionally, the run of six is singular, i.e., it cannot appear with any other alignment with reference to the 8B boundaries and can serve as the comma.

To generate the comma of six zeros in the context of a control character, one of the control characters (e.g., K170) is defined with a trailing run of three zeros. This character may be followed by any of the four data characters (e.g., D027, D033, D035, or D036) from the set of FIG. 5 with a leading run of three zeros. An equivalent, alternate comma of six ones is generated from another control character (K107) with a trailing run of three ones followed by any of the four data characters (D341, D342, D344, D350) from the set of FIG. 6 with a leading run of three ones. This allows the signaling and check of both vector alignment and start or end of frame by a pair of vectors.

Alternate vector pairs combining the comma and control features could be defined by placing a data vector with a trailing run of three first and a control vector with a leading run of three second. This would require changes in some of the coding tables and is mentioned here only for completeness.

In normal data traffic, there will also be sequences of six ones or zeros with identical alignment which can also be used for alignment or alignment checks.

Another possibility to cause alignment is to check the running disparity at six-baud intervals in a random sequence of coded vectors and stepping the alignment until the value at the boundaries assumes a steady value which then can be assumed to be zero and should remain there in the absence of errors.

6B/8B Encoding Table

Figure 3:
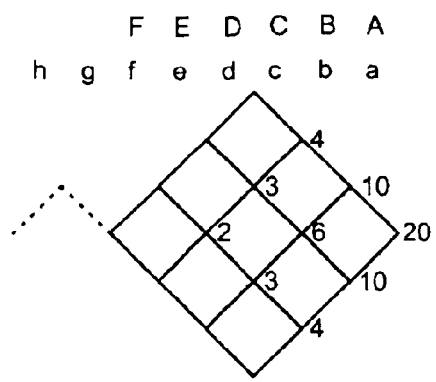
FIGS. 3 through 6 illustrate coded vector sets into which the coded vectors of FIG. 2 are divided.
Figure 4:
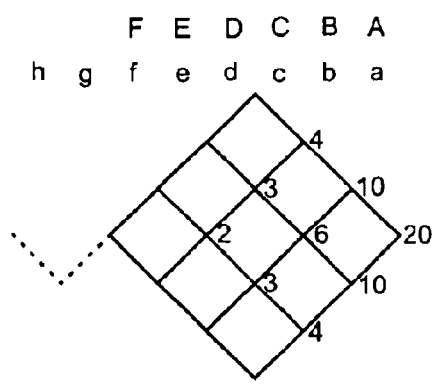
Figure 5:
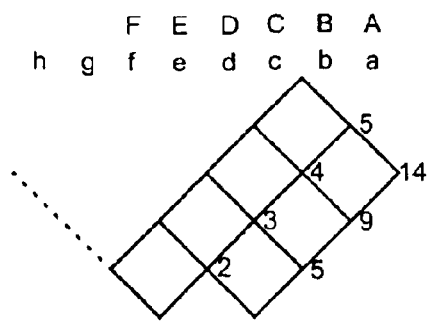
Figure 6:
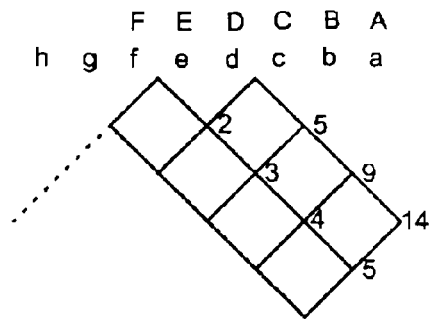

As described in the General Description of the 6B/8B Transmission Code section above, the sixty-eight coded eight-bit (8B) vectors of FIG. 2 are divided into four sets, each having coded vectors, as illustrated by the trellis diagrams of FIGS. 3, 4, 5, and 6. The solid lines in FIGS. 3, 5, and 6 represent 48 of the source vectors that remain unchanged in the encoded domain except for the two-bit prefix. The trellis diagram of FIG. 4 represents the four control vectors and the remaining 16 data vectors.

The 48 coded 8-bit vectors of FIG. 3, 5, and 6 that require no changes for encoding are listed in the table of FIG. 7. The 20 vectors of FIG. 4 are listed in the table of FIG. 8. The ten source vectors on the left side of the table have a negative disparity. The ten source vectors with positive disparity on the right side are the exact complements of those on the left side. Sixteen of these vectors require changes for encoding as follows:

1. The two vectors with all ones or zeros and a disparity of six are balanced by complementing three bits.
2. The 12 vectors with a disparity of four are encoded by complementing two bits.
3. The two data vectors with a disparity of two and a trailing run length of four are balanced by the complementation of a single bit.

The coded bits which are the complements of the respective source bits are printed in bold type and underlined. Note the symmetries in the pattern of complemented bits for the set of 16 data vectors between the left and right side of the table of FIG. 8 and between the 'abc' bits of the vectors D10, D20, and D40 and the 'fed' bits of the vectors D04, D02, and D01, respectively. The bit-positions complemented for encoding are identical for each pair of complementary vectors. This feature simplifies the encoding and decoding equations. The complete 6B/8B coding assignments are shown in the table of FIG. 9.

D. Generation of Encoded 8B Vectors

For the derivation of the encoding equations refer to the tables of FIGS. 8 and/or 9. Generally, the encoded bits retain the value of the uncoded bit (a=A, b=B, etc), but a specific source bit is complemented (a=A', b=B', etc) if and only if (iff) the respective equation is true. In the coding labels and equations, some bit values are included redundantly to allow more circuit sharing for the coding of several bits. Redundant bit values have a line above them (overline) and redundant vector names are preceded by an asterisk.

Encoded Bit a

The 'a' column has bold entries for D00, D04, D10, D20, D40, D37, D57, D67, D73, and D77. The respective uncoded bits FEDCBA are listed in the table shown in FIG. 10A, the A-bit is overlined, and common patterns in the source bits are marked by bold type to logically classify the vectors by simple expressions.

Using these identifiers, the encoding equation for bit 'a' can be written as follows:

$$a = A \cdot (\overline{AB} \cdot E \cdot F \cdot C \oplus D + \bar{A} \cdot B \cdot C \cdot D \cdot E \oplus F + \bar{A} \cdot B \cdot C \cdot D \cdot E \cdot F)' + \bar{A}' \cdot B' \cdot E' \cdot F' \cdot C \oplus D + \bar{A}' \cdot B' \cdot C' \cdot D' \cdot E \oplus F + \bar{A}' \cdot B' \cdot C' \cdot D' \cdot E' \cdot F'$$

Figure 11A:
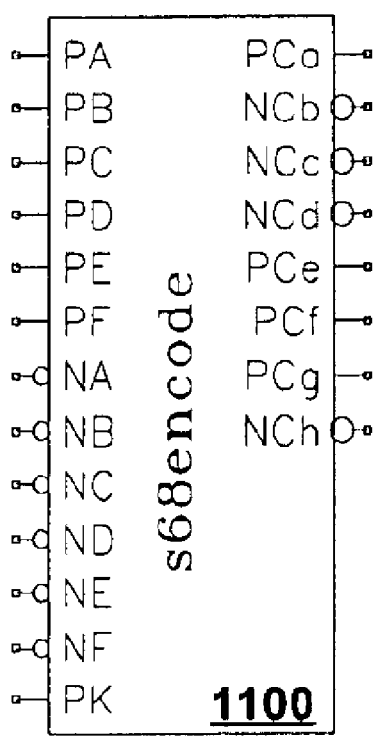
FIG. 11A is a block diagram of a 6B/8B encoder.
Figure 11B:
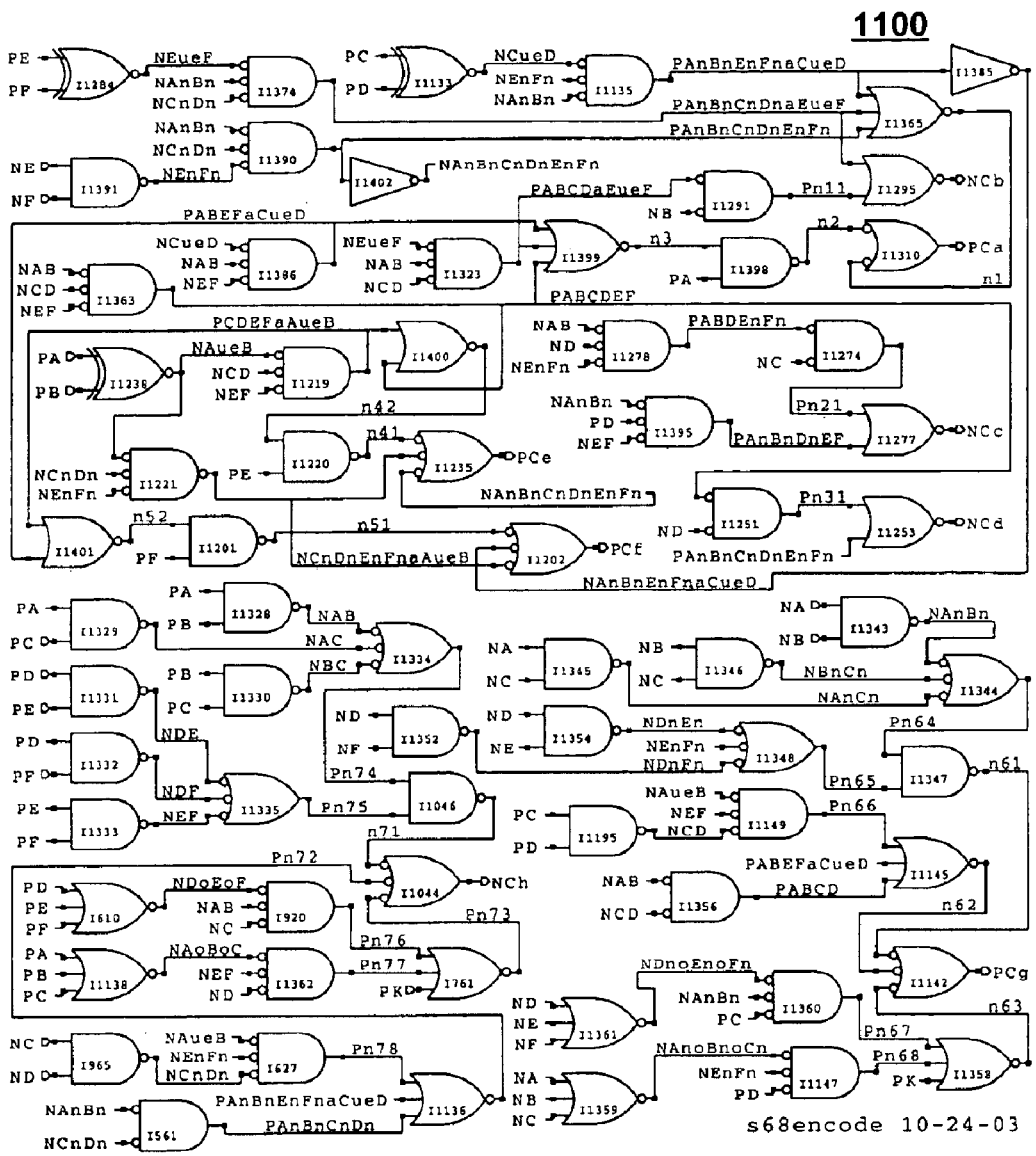
FIG. 11B is an exemplary circuit diagram of the 6B/8B encoder of FIG. 11A.

In the circuit diagram of FIG. 11B, the following net names are used:

$$n1 = \bar{A}' \cdot B' \cdot E' \cdot F' \cdot C \oplus D + \bar{A}' \cdot B' \cdot C' \cdot D' \cdot E \oplus F + \bar{A}' \cdot B' \cdot C' \cdot D' \cdot E' \cdot F'$$

$$n2 = A \cdot (n3)'$$

$$n3 = \bar{A} \cdot B \cdot E \cdot F \cdot C \oplus D + \bar{A} \cdot B \cdot C \cdot D \cdot E \oplus F + \bar{A} \cdot B \cdot C \cdot D \cdot E \cdot F$$

Encoded Bit b

The 'b' column has bold entries for D20, D40, D37, and D57. The respective uncoded bits FEDCBA are listed in the table shown in FIG. 10B, the B-bit is overlined, and common patterns are marked.

Using these identifiers, the encoding equation for bit 'b' can be written as follows:

$$b = B \cdot (A \cdot \bar{B} \cdot C \cdot D \cdot E \oplus F)' + A' \cdot \bar{B}' \cdot C' \cdot D' \cdot E \oplus F$$

In the circuit diagram shown in FIG. 11B, the following net name is used:

$$n11 = B \cdot (A \cdot \bar{B} \cdot C \cdot D \cdot E \oplus F)'$$

Encoded Bit c

The 'c' column has bold entries for D60 and D17. The respective uncoded bits FEDCBA are listed in the table shown in FIG. 10C, and the C-bit is overlined.

Using these identifiers, the encoding equation for bit 'c' can be written as follows:

$$c = C \cdot (A \cdot B \cdot D \cdot E' \cdot F')' + A' \cdot B' \cdot D' \cdot E \cdot F$$

In the circuit diagram shown in FIG. 11B, the following net name is used:

$$n21 = C \cdot (A \cdot B \cdot D \cdot E' \cdot F')'$$

Encoded Bit d

The 'd' column has bold entries for D00 and D77. The respective uncoded bits FEDCBA are listed in the table shown in FIG. 10D, and the D-bit is overlined.

Using these identifiers, the encoding equation for bit 'd' can be written as follows:

$$d = D \cdot (A \cdot B \cdot C \cdot \bar{D} \cdot E \cdot F)' + A' \cdot B' \cdot C' \cdot \bar{D}' \cdot E' \cdot F'$$

In the circuit diagram of FIG. 11B, the following net name is used:

$$n31 = D \cdot (A \cdot B \cdot C \cdot \bar{D} \cdot E \cdot F)'$$

Encoded Bit e

The 'e' column has bold entries for D00, D01, D02, D75, D76, and D77. The table shown in FIG. 10E lists the respective uncoded bits FEDCBA, the E-bit is overlined, and common patterns are marked by bold entries.

Using these identifiers, the encoding equation for bit 'e' can be written as follows:

$$e = E \cdot (C \cdot D \cdot \bar{E} \cdot F \cdot A \oplus B + A \cdot B \cdot C \cdot D \cdot \bar{E} \cdot F)' + C' \cdot D' \cdot F' \cdot A \oplus B + A' \cdot B' \cdot C' \cdot D' \cdot F'$$

In the circuit diagram of FIG. 11B, the following net name is used:

$$n41 = E \cdot (n42)'$$

$$n42 = C \cdot D \cdot \bar{E} \cdot F \cdot A \oplus B + A \cdot B \cdot C \cdot D \cdot \bar{E} \cdot F$$

Encoded Bit f

The 'f' column has bold entries for D01, D02, D04, D10, D67, D73, D75, and D76. The respective uncoded bits FEDCBA are listed in the table shown in FIG. 10F. The F-bit which must be complemented for encoding it is overlined, and common patterns are marked by bold entries.

The encoding equation for bit 'f' can be written as follows:

$$f = F \cdot (C \cdot D \cdot E \cdot \bar{F} \cdot A \oplus B + A \cdot B \cdot E \cdot \bar{F} \cdot C \oplus D)' + C' \cdot D' \cdot E' \cdot \bar{F}' \cdot A \oplus B + A' \cdot B' \cdot E' \cdot \bar{F}' \cdot C \oplus D$$

In the circuit diagram shown in FIG. 11B, the following net name is used:

$$n51 = F \cdot (n52)'$$

$$n52 = C \cdot D \cdot E \cdot \bar{F} \cdot A \oplus B + A \cdot B \cdot E \cdot \bar{F} \cdot C \oplus D$$

Encoded Bit g

The value for bit 'g' is one for the 34 vectors of FIG. 4 and FIG. 6. These vectors are enumerated in the right column of the table shown in FIG. 7 and the table shown in FIG. 8. Note that the source vectors for all coded vectors of the table of FIG. 7 are identical to the trailing six bits of the respective coded vector and are not listed explicitly.

The 34 source vectors for which the value for bit 'g' is one are sorted according to shared bit patterns and listed again in the table of FIG. 10G. All 22 source vectors with four or more zeros are part of this set. For the derivation of logical encoding equations, these 22 vectors are grouped into three overlapping sets. The redundant vectors are marked by an asterisk. The set of seven source vectors at the top left side of the table is characterized by three trailing zeros and at least one bit with a value of zero in the leading three bit positions which is described by the logic expression A'·B'·C'·(D'+E'+F'). The set of six source vectors (not counting the redundant vector *D00) at the top right side of the table is characterized by three leading zeros and at least one bit with a value of zero in the trailing three bit positions which is described by the logic expression (A'+B'+C')·D'·E'·F'. The set of nine vectors (not counting the redundant vectors) at the bottom of the left side is characterized by at least two zeros in the leading three positions and at least two zeros in the trailing three positions which is described by the logic expression (A'·B'+A'·C'+B'·C')·(D'·E'+D'·F'+E'·F').

The four vectors on the right side of FIG. 10G with a trailing run of four ones are identified by the logic expression A·B·C·D. The two vectors in FIG. 10G with four leading ones are identified by the logic expression C·D·E·F·A⊕B and the two vectors with two leading ones and two trailing ones are identified by the logic expression A·B·E·F·C⊕D.

Finally, all four control vectors identified by a K-value of one have a g-value of one.

The logic equation for the encoding of the g-bit can thus be expressed as follows:

$$g = A' \cdot B' \cdot C' \cdot (D' + E' + F') + (A' + B' + C') \cdot D' \cdot E' \cdot F' + A \cdot B \cdot C \cdot D + C \cdot D \cdot E \cdot F \cdot A \oplus B + A \cdot B \cdot E \cdot F \cdot C \oplus D + (A' \cdot B' + A' \cdot C' + B' \cdot C') \cdot (D' \cdot E' + D' \cdot F' + E' \cdot F') + K$$

In the circuit diagram shown in FIG. 11B, the following net names are used:

$$n61=n64 \cdot n65 \quad n62=n66+A \cdot B \cdot C \cdot D+A \cdot B \cdot E \cdot F \cdot C \oplus D$$

$$n63=n67+n68+K \quad n64=A' \cdot B'+A' \cdot C'+B' \cdot C'$$

$$n65=D' \cdot E'+D' \cdot F'+E' \cdot F' n66=C \cdot D \cdot E \cdot F \cdot A \oplus B$$

$$n67=A' \cdot B' \cdot C' \cdot (D'+E'+F') \quad n68=(A'+B'+C') \cdot D' \cdot E' \cdot F'$$

Encoded Bit h

The value for bit 'h' is zero for all 34 vectors of FIG. 4 and FIG. 5. These vectors are enumerated in the center column of the table shown in FIG. 7 and in the table shown in FIG. 8. Note that the source vectors for all coded vectors of the table of FIG. 7 are identical to the trailing six bits of the respective coded vector and are not listed explicitly.

The 34 source vectors for which the value for bit 'h' is zero are sorted and listed again in the table shown in FIG. 10H. All 22 source vectors with four or more ones are part of this set. For the derivation of logical encoding equations, these 22 vectors are grouped into three overlapping sets. The redundant vectors are marked by an asterisk. The set of seven source vectors at the top of the left side is characterized by three trailing ones and at least one bit with a value of one in the leading three bit positions which is described by the logic expression $A \cdot B \cdot C \cdot (D+E+F)$. The set of six source vectors (not counting the redundant vector *D77) at the top of the right side is characterized by three leading ones and at least one bit with a value of one in the trailing three bit positions which is described by the logic expression $(A+B+C) \cdot D \cdot E \cdot F$. The set of nine vectors (not counting the redundant vectors) at the bottom of the left side is characterized by at least two ones in the trailing three positions and at least two ones in the leading three positions, which is described by the logic expression $(A \cdot B+A \cdot C+B \cdot C) \cdot (D \cdot E+D \cdot F+E \cdot F)$.

The four vectors with a trailing run of four zeros on the right side are identified by the logic expression $A' \cdot B' \cdot C' \cdot D'$. The two vectors with four leading zeros are identified by the logic expression $C' \cdot D' \cdot E' \cdot F' \cdot A \oplus B$. The two vectors with two leading and two trailing zeros are identified by the logic expression $A' \cdot B' \cdot E' \cdot F' \cdot C \oplus D$.

Finally, all four control vectors identified by a K-value of one have an h-value of zero. The logic equation for the encoding of the h-bit can thus be expressed as follows:

$$h=\{A \cdot B \cdot C \cdot (D+E+F)+(A+B+C) \cdot D \cdot E \cdot F+(A \cdot B+A \cdot C+B \cdot C) \cdot (D \cdot E+D \cdot F+ E \cdot F)+A' \cdot B' \cdot C' \cdot D'+C' \cdot D' \cdot E' \cdot F' \cdot A \oplus B+A' \cdot B' \cdot E' \cdot F' \cdot C \oplus D+K\}'$$

In the circuit diagram of FIG. 1I B, the following net names are used:

$$n71=n74 \cdot n75 \quad n72=n78+A' \cdot B' \cdot C' \cdot D'+A' \cdot B' \cdot E' \cdot F' \cdot C \oplus D$$

$$n73=n76+n77+K \quad n74=A \cdot B+A \cdot C+B \cdot C$$

$$n75=D \cdot E+D \cdot F+E \cdot F \quad n76=A \cdot B \cdot C \cdot (D+E+F)$$

$$n77=(A+B+C) \cdot D \cdot E \cdot F \quad n78=C' \cdot D' \cdot E' \cdot F' \cdot A \oplus B$$

E. Circuit Implementation of the 6B/8B Encoder

FIG. 11A is a symbol of the encoder circuit 1100 showing the inputs and outputs. In the example of FIGS. 11A and 11B, both the input data bits (e.g., PA through PF) and the inverted versions of the input data bits (e.g., NA through NF) are input to the encoder circuit 1100, although the encoder circuit can also perform inversion.

FIG. 11B is the logic diagram of the encoder circuit 1100. The encoder circuit 1100 takes input data bits (e.g., PA through PF) and the inverted versions of the input data bits (e.g., NA through NF), along with a control signal PK, and outputs the coded vector PCa, NCb, NCc, NCd, PCe, PCf, PCg, NCh, where the coded bits NCb, NCc, NCd and NCh would typically be inverted for use either in the encoder itself or preferably in some subsequent circuit such as a latch to achieve lower delay penalties. The logic shown in FIG. 11B can be determined using the tables of FIGS. 10A through 10H or the associated logic equations by one skilled in the art.

Alternate Implementation of Encoder

Because of the symmetries between the left and right side of the table of FIG. 8, all the encoding equations for the bits a through f have complementary features which can be exploited by the extensive use of the Exclusive OR function. The transformed coding equations for the bits a through f are presented here:

$$a=A \oplus \{\bar{A} \oplus B' \cdot (B \oplus E' \cdot E \oplus F' \cdot C \oplus D+B \oplus C' \cdot C \oplus D' \cdot E \oplus F+ B \oplus C' \cdot C \oplus D' \cdot D \oplus E' \cdot E \oplus F')\}$$

$$b=B \oplus (A \oplus \bar{B} \cdot \bar{B} \oplus C' \cdot C \oplus D' \cdot E \oplus F)$$

$$c=C \oplus (A \oplus B' \cdot B \oplus D' \cdot D \oplus E \cdot E \oplus F')$$

$$d=D \oplus (A \oplus B' \cdot B \oplus C' \cdot C \oplus \bar{D} \cdot \bar{D} \oplus E' \cdot E \oplus F')$$

$$e=E \oplus \{(E \oplus \bar{F}') \cdot (C \oplus D' \cdot D \oplus E' \cdot A \oplus B' \cdot B \oplus C')\}$$

$$f=F \oplus \{(E \oplus \bar{F}') \cdot (C \oplus D' \cdot D \oplus E' \cdot A \oplus B+A \oplus B' \cdot B \oplus E' \cdot C \oplus D)\}$$

An implementation based on these alternate equations may be advantageous in terms of silicon area. To support a selection for a particular technology and application, the circuit delay and the total circuit capacity related to power dissipation should also be be considered.

F. Generation of Decoded 6B Vectors

For all encoded vectors 'hgfedcba' with a value hg 01 the decoded bits FEDCBA are equal to the encoded bits 'fedcba' and the value of the K-bit is zero. If hg=01, the decoding equations can be derived from the tables shown in FIG. 8 or 9 as shown below.

Decoded Bit A

The 'a' column of the table shown in FIG. 8 has bold entries for D131, D145, D151, D123, D143, D146, D132, D126, D154, and D134. The respective coded bits 'hgfedcba' are listed in the table shown in FIG. 12A, the a-bit is overlined to indicate redundancy, and common patterns are marked bold type to logically classify the vectors by simple expressions.

For the vectors D131 and D146, the overlined bit 'a' is added redundantly to the decoding equation so the expressions can be shared with D-bit and E-bit decoding. For the vectors D145, D151, D132, and D126, the overlined bit 'a' is added redundantly so the expressions can be shared with F-bit decoding. For the vectors D123, D143, D154, and D134, the overlined bit 'a' is added redundantly so the expressions can be shared with B-bit decoding. Using these identifiers, the decoding equation for bit 'A' can be written as follows:

$$A=a \cdot (\overline{a \cdot b' \cdot c' \cdot d \cdot e \cdot f' \cdot g \cdot h'}+$$

$$\overline{a} \cdot b' \cdot e \cdot f \cdot g \cdot h' \cdot c \oplus d + \overline{a}$$

$$\cdot b \cdot c' \cdot d' \cdot g \cdot h' \cdot e \oplus f)'$$

$$+\overline{a} \cdot b \cdot c \cdot d' \cdot e' \cdot f \cdot g \cdot h'$$

$$+\overline{a} \cdot b \cdot e \cdot f' \cdot g \cdot h' \cdot c \oplus d + \overline{a}'$$

$$\cdot b' \cdot c \cdot d \cdot g \cdot h' \cdot e \oplus f$$

Figure 13A:
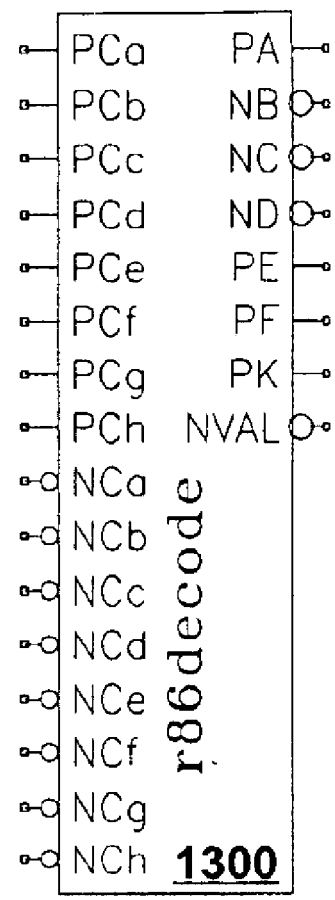
FIG. 13A is a block diagram of a 6B/8B decoder.
Figure 13B:
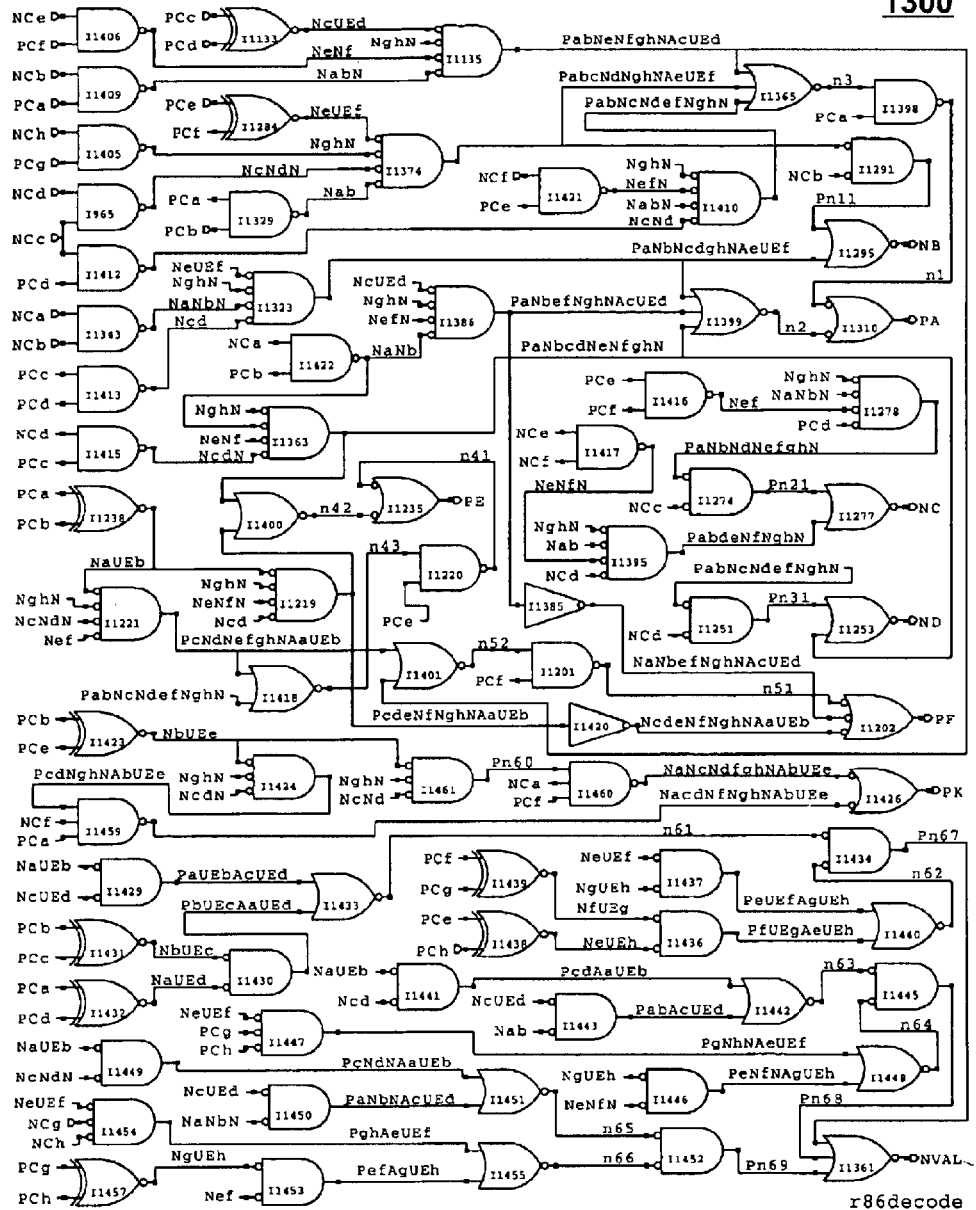
FIG. 13B is an exemplary circuit diagram of the 6B/8B decoder of FIG. 13A.

In the circuit diagram of FIG. 13B, the following net names are used:

$$n1 = a \cdot n3'$$

$$n2 = \bar{a} \cdot b \cdot c \cdot d \cdot e' \cdot f \cdot g \cdot h' + \bar{a} \cdot b \cdot e \cdot f \cdot g \cdot h' \cdot c \oplus d + \bar{a} \cdot b' \cdot c \cdot d \cdot g \cdot h' \cdot e \oplus f$$

$$n3 = \bar{a} \cdot b' \cdot c' \cdot d \cdot e \cdot f \cdot g \cdot h' + \bar{a} \cdot b' \cdot e' \cdot f \cdot g \cdot h' \cdot c \oplus d + \bar{a} \cdot b \cdot c' \cdot d' \cdot d' \cdot g \cdot h' \cdot e \oplus f$$

Decoded Bit B

The 'b' column of the table shown in FIG. 8 has bold entries for D123, D143, D154, and D134. The respective coded bits 'hgfedcba' are listed in the table shown in FIG. 12B, the b-bit is overlined, and common patterns are marked by bold type. The overlined bit 'b' is added redundantly to the decoding equation so the expressions can be shared with A-bit decoding.

Using these identifiers, the decoding equation for bit 'B' can be written as follows:

$$B = \bar{b} \cdot (a \cdot \bar{b} \cdot c' \cdot d' \cdot h' \cdot e \oplus f)' + a' \cdot \bar{b} \cdot c \cdot d \cdot g \cdot h' \cdot e \oplus f$$

In the circuit diagram of FIG. 13B, the following net name is used:

$$n11 = b \cdot (a \cdot \bar{b} \cdot c' \cdot d' \cdot g \cdot h' \cdot e \oplus f)'$$

Decoded Bit C

The 'c' column of the table of FIG. 8 has bold entries for D164 and D113. The respective coded bits 'hgfedcba' are listed in the table shown in FIG. 12C.

Using these identifiers, the decoding equation for bit 'C' can be written as follows:

$$C = c \cdot (a' \cdot b' \cdot d' \cdot e \cdot f \cdot g \cdot h)' + a \cdot b \cdot d \cdot e' \cdot f \cdot g \cdot h'$$

In the circuit diagram of FIG. 13B, the following net name is used:

$$n21 = c \cdot (a' \cdot b' \cdot d' \cdot e \cdot f \cdot g \cdot h)'$$

Decoded Bit D

The 'd' column of the table of FIG. 8 has bold entries for D131 and D146. The respective coded bits 'hgfedcba' are listed in the table of FIG. 12D. The overlined bit "d" in the equations that follow is added redundantly to the decoding equation so the expressions can be shared with A-bit and E-bit decoding.

Using these identifiers, the decoding equation for bit 'D' can be written as follows:

$$D = \bar{d} \cdot (a \cdot b' \cdot c' \cdot \bar{d} \cdot e \cdot f \cdot g \cdot h')' + a' \cdot b \cdot c \cdot \bar{d} \cdot e' \cdot f \cdot g \cdot h'$$

In the circuit diagram of FIG. 13B, the following net name is used:

$$n31 = d \cdot (a \cdot b' \cdot c' \cdot \bar{d} \cdot e \cdot f \cdot g \cdot h')'$$

Decoded Bit E

The 'e' column of the table shown in FIG. 8 has bold entries for D131, D161, D162, D146, D116, and D115. The table shown in FIG. 12E lists the respective coded bits 'hgfedcba', the e-bit is overlined, and common patterns are marked by bold entries.

For the vectors D131 and D146, the overlined bit 'e' in the equations that follow is added redundantly to the decoding equation so the expression can be shared with A-bit and D-bit decoding. For the vectors D161, D162, D116, and D115, the overlined bit 'e' is added redundantly so the expression can be shared with F-bit decoding. Using these identifiers, the encoding equation for bit 'e' can be written as follows:

$$E = \bar{e} \cdot (a \cdot b' \cdot c' \cdot d \cdot \bar{e} \cdot f \cdot g \cdot h' + c' \cdot d' \cdot \bar{e} \cdot f \cdot g \cdot h' \cdot a \oplus b)' + a' \cdot b \cdot c \cdot d \cdot \bar{e} \cdot f \cdot g \cdot h' + c \cdot d \cdot \bar{e} \cdot f \cdot g \cdot h' \cdot a \oplus b$$

In the circuit diagram of FIG. 13B, the following net name is used:

$$n41 = e \cdot n43'$$

$$n42 = a' \cdot b \cdot c \cdot d \cdot \bar{e} \cdot f \cdot g \cdot h' + c \cdot d \cdot \bar{e} \cdot f \cdot g \cdot h' \cdot a \oplus b$$

$$n43 = (a \cdot b' \cdot c' \cdot d \cdot \bar{e} \cdot f \cdot g \cdot h' + c' \cdot d' \cdot \bar{e} \cdot f \cdot g \cdot h' \cdot a \oplus b)'$$

Decoded Bit F

The 'f' column of the table in FIG. 8 has bold entries for D161, D162, D145, D151, D116, D115, D132, and D126. The respective coded bits 'hgfedcba' are listed in the table of FIG. 12F. The f-bit which must be complemented for encoding is overlined.

For the vectors D161, D162, D116, and D115, the overlined bit 'f' in the equations that follow is added redundantly to the decoding equation so the expression can be shared with E-bit decoding. For the vectors D145, D151, D132, and D126, the overlined bit 'f' is added redundantly so the expression can be shared with A-bit decoding. The decoding equation for bit 'F' can be written as follows:

$$F = \bar{f} \cdot (c' \cdot d' \cdot \bar{f} \cdot g \cdot h' \cdot a \oplus b + a \cdot b' \cdot e' \cdot \bar{f} \cdot g \cdot h' \cdot c \oplus d)' + c \cdot d \cdot e' \cdot \bar{f} \cdot g \cdot h' \cdot a \oplus b + a' \cdot b \cdot e \cdot \bar{f} \cdot g \cdot h' \cdot c \oplus d$$

In the circuit diagram of FIG. 13B, the following net name is used:

$$n52 = f \cdot n52'$$

$$n52 = c' \cdot d' \cdot e \cdot \bar{f} \cdot g \cdot h' \cdot a \oplus b + a \cdot b' \cdot e' \cdot \bar{f} \cdot g \cdot h' \cdot c \oplus d$$

Decoded Bit K

The 'K' column of the tables of FIGS. 8 and 9 has a value of one for the four coded vectors K107, K125, K170, and K152. The respective coded bits 'hgfedcba' are listed in the table of FIG. 12G.

The decoding equation for bit 'K' can be written as follows:

$$K = a \cdot c \cdot d' \cdot f \cdot g \cdot h' \cdot b \oplus e + a' \cdot c' \cdot d \cdot f \cdot g \cdot h' \cdot b \oplus e$$

In the circuit diagram of FIG. 13B, the following net name is used:

$$n60 = c' \cdot d \cdot g \cdot h' \cdot b \oplus e$$

G. Validity Checks

Any received vector, which does not fit the trellis of FIG. 2, or is not listed in the table of FIG. 9, is invalid. Since only 68 vectors out of the total of 256 eight-bit vectors are valid, there are a total of 188 invalid vectors. The circuitry to verify that a vector belongs to the set of valid vectors is less complex than circuitry which flags invalid vectors. The validity checks can be derived directly from the trellis of the table of FIG. 2 by using three sets of overlapping complementary circuits which pass through the center nodes labeled with the numbers 4, 6, and 4.

$$VALID = (a \oplus b \cdot c \oplus d + b \oplus c \cdot a \oplus d) \cdot (e \oplus f \cdot g \oplus h + f \oplus g \cdot e \oplus h) + (c \cdot d \cdot a \oplus b + a \cdot b \cdot c \oplus d) \cdot (g' \cdot h' \cdot e \oplus f + e' \cdot f' \cdot g \oplus h) + (c' \cdot d' \cdot a \oplus b + a' \cdot b' \cdot c \oplus d) \cdot (g \cdot h \cdot e \oplus f + e \cdot f \cdot g \oplus h)$$

In the circuit diagram of FIG. 13B, the following net names are used:

$$n61 = a \oplus b \cdot c \oplus d + b \oplus c \cdot a \oplus d \quad n62 = e \oplus f \cdot g \oplus h + f \oplus g \cdot e \oplus h$$

$$n63 = c \cdot d \cdot a \oplus b + a \cdot b \cdot c \oplus d \quad n64 = g \cdot h \cdot e \oplus f + e \cdot f \cdot g \oplus h$$

$n65 = c' \cdot d' \cdot a \oplus b + a' \cdot b' \cdot c \oplus d \quad n66 = g \cdot h \cdot e \oplus f + e \cdot f \cdot g \oplus h$ $n67 = n61 \cdot n62 \quad n68 = n63 \cdot n64$ $n69 = n65 \cdot n66$

H. Circuit Implementation of the 8B/6B Decoder

FIG. 13A is a symbol of the decoder circuit 1300 showing the inputs and outputs.

FIG. 13B is the logic diagram of the decoder circuit 1300. The decoder circuit 1300 accepts a coded vector (e.g., PCa through PCh) and the inverse of the coded vector (e.g., NCa through NCh) and produces an output decoded vector PA, NB, NC, ND, PE, and PF. Additionally, the control signal PK is also produced. Typically, NB, NC, and ND would be inverted in some subsequent circuit, e.g., a latch. The decoder circuit 1300 also produces a NVAL signal that indicates at the lower level that the received coded vector is valid. The upper level indicates an invalid vector.

The logic shown in FIG. 13B can be determined using the tables of FIGS. 12A through 12G or the associated logic equations by one skilled in the art.

Alternate Implementation of Decoder

As for encoding, all the decoding equations for the bits A through F, bit K, and the Validity check have complementary features which can be expoited by the extensive use of the Exclusive OR function. The transformed coding equations for the bits a through f, bit K, and VALID are presented here:

$A = a \oplus \{ (e \oplus f \cdot g \cdot h') \cdot \overline{(a \oplus b \cdot b \oplus c' \cdot c \oplus d \cdot d \oplus e' + \bar{a} \oplus b \cdot b \oplus e' \cdot c \oplus d + \bar{a} \oplus b' \cdot b \oplus c \cdot c \oplus d')} \}$ $B = b \oplus (a \oplus b' \cdot b \oplus c \cdot c \oplus d' \cdot e \oplus f \cdot g \cdot h')$ $C = c \oplus (a \oplus b' \cdot b \oplus d' \cdot d \oplus e \cdot e \oplus f' \cdot g \cdot h')$ $D = d \oplus (a \oplus b \cdot b \oplus c' \cdot c \oplus d \cdot d \oplus e' \cdot e \oplus f \cdot g \cdot h')$ $E = e \oplus \{ (a \oplus b \cdot g \cdot h') \cdot (b \oplus c' \cdot c \oplus d \cdot d \oplus \bar{e}' \cdot \bar{e} \oplus f + c \oplus d' \cdot d \oplus \bar{e} \cdot \bar{e} \oplus f') \}$ $F = f \oplus \{ (a \oplus b \cdot g \cdot h') \cdot (c \oplus d' \cdot d \oplus e \cdot e \oplus f' + b \oplus e' \cdot c \oplus d \cdot e \oplus f) \}$ $K = \{ (b \oplus e \cdot g \cdot h') \cdot (a \oplus c' \cdot c \oplus d \cdot d \oplus f') \}$ $\text{VALID} = (a \oplus b \cdot c \oplus d + b \oplus c \cdot a \oplus d) \cdot (e \oplus f \cdot g \oplus h + f \oplus g \cdot e \oplus h) +$ $(a \oplus b \cdot c \oplus d' + a \oplus b' \cdot c \oplus d) \cdot (e \oplus f \cdot g \cdot h' + e \oplus f'$ $\cdot g \oplus h) \cdot (c \oplus g \cdot d \oplus h + a \oplus e \cdot b \oplus f)$ The second and third line of the original equation for VALID have been merged. The same comments apply to the alternate decoding circuits as for the alternate encoding circuits.

I. Implementation Summary

An encoding circuit for the 6B/8B-P code can be built with 69 Standard Primitive Logic Cells (e.g., 2×fNV, 8×NAND3, 20×NAND2, 26×NOR3, 10×NOR2, 3×XNOR2). Assuming complementary inputs, there are no more than five cells in any logic path. Similarly, the decoding circuit including the validity check requires no more than 78 cells (2×INV, 3×NAND3, 19×NAND2, 10×NOR4, 7×NOR3, 28×NOR2, 9×XNOR2) and no more than five cells in any logic path. An alternate implementation with extensive use of the Exclusive OR function may be implemented with less silicon area.

It is to be understood that the embodiments and variations shown and described herein are merely illustrative of the principles of this invention and that various modifications may be implemented by those skilled in the art without departing from the scope and spirit of the invention. For instance, the bits used to create balanced coded vectors may be placed anywhere within the coded vector and the bits defining the uncoded or coded vectors may be reversed.

What is claimed is:

1. A method of producing a Direct Current (DC) balanced 6B/8B transmission code from an input data stream that includes one or more six-bit source vectors, the method comprising the steps of:
   creating, in accordance with an eight binary digit coded vector set, a given coded vector having eight binary digits for a given six-bit source vector of the one or more six-bit source vectors, wherein each coded vector in the eight binary digit coded vector set is balanced; and
   outputting the given coded vector.

2. The method of claim 1, wherein the six-bit source vectors are divided into a plurality of sets of six-bit source vectors for the eight binary digit coded vector set.

3. The method of claim 2, wherein one of the plurality of sets comprises all balanced six-bit source vectors.

4. The method of claim 3, wherein the step of creating further comprises the steps of:
   selecting a bit sequence of either one followed by zero or zero followed by one; and
   adding the selected bit sequence to a six-bit source vector in accordance with the eight binary digit coded vector set to create the given coded vector.

5. The method of claim 4, wherein a second set of the plurality of sets of six-bit source vectors comprises a third set of ten vectors with negative disparity and a fourth set of ten vectors with a positive disparity, each of the vectors in the fourth set being an exact complement of a corresponding vector in the third set.

6. The method of claim 2, wherein one of the plurality of sets comprises all six-bit source vectors with a disparity of plus two with an exception of a six-bit source vector with a trailing run of four ones.

7. The method of claim 6, wherein the step of creating further comprises the step of adding a two-bit sequence having values of zero and zero to a six-bit source vector in accordance with the eight binary digit coded vector set to create the given coded vector.

8. The method of claim 2, wherein one of the plurality of sets comprises all six-bit source vectors with a disparity of minus two with an exception of a source vector with a trailing run of four zeros.

9. The method of claim 8, wherein the step of creating further comprises the step of adding a two-bit sequence having values of one and one to a six-bit source vector in accordance with the eight binary digit coded vector set to create the given coded vector.

10. The method of claim 2, wherein:
    a first set of the plurality of sets comprises all balanced six-bit source vectors;
    the step of creating further comprises the steps of:
       selecting a two-bit sequence of either one followed by zero or zero followed by one; and
       adding the selected two-bit sequence to a six-bit source vector from the first set in accordance with the eight binary digit coded vector set to create the given coded vector; and
    a second set of the plurality of sets of six-bit source vectors comprises fourteen six-bit source vectors with a disparity of four or six, two six-bit source vectors with a disparity of two and a trailing run of four, and four control vectors.

11. The method of claim 10, wherein the step of creating further comprises the step of adding another two-bit sequence that comprises complements of the values of the selected two-bit sequence to a six-bit source vector from the second set in accordance with the eight binary digit coded vector set to create the given coded vector.

12. The method of claim 11, wherein the step of creating further comprises the step of complementing one to three bits of 16 six-bit source vectors from the second set in such a way that 16 unique six-bit vectors are generated that are balanced with no leading or trailing run of three.

13. The method of claim 12, wherein the 16 six-bit source vectors comprise eight pairs of six-bit source vectors, each pair comprising a six-bit source vector with positive disparity and a corresponding complemented six-bit source vector with negative disparity, and wherein the step of complementing one to three bits involves complementing identical bit positions in any pair of six-bit source vectors.

14. The method of claim 12, wherein the eight-bit coded vectors created using the first set comprise coded data vectors, the eight-bit coded vectors created using the second set comprise coded data and control vectors, and wherein the step of adding two bits that are complements is performed so that when a control input is activated together with any of four predetermined balanced six-bit source vectors, one of four coded control vectors is generated.

15. The method of claim 14, wherein at least one of the coded control vectors has a trailing run of three.

16. The method of claim 15, wherein the coded control vector with a trailing run of three is followed by a coded data vector with a leading run of three whose values match values of the trailing run of three of the control character to generate a two coded vector synchronizing comma sequence.

17. An encoder for producing a Direct Current (DC) balanced 6B/8B transmission code from an input data stream that includes one or more six-bit source vectors, the encoder adapted:
to create, in accordance with an eight binary digit coded vector set, a given coded vector having eight binary digits for a given six-bit source vector of the one or more six-bit source vectors, wherein each coded vector in the eight binary digit coded vector set is balanced; and
to output the given coded vector.

18. A semiconductor comprising at least one encoder for producing a Direct Current (DC) balanced 6B/8B transmission code from an input data stream that includes one or more six-bit source vectors, the at least one encoder adapted:
to create, in accordance with an eight binary digit coded vector set, a given coded vector having eight binary digits for a given six-bit source vector of the one or more six-bit source vectors, wherein each coded vector in the eight binary digit coded vector set is balanced; and
to output the given coded vector.

19. A method of decoding a Direct Current (DC) balanced 6B/8B transmission code from an input data stream that includes one or more eight-bit coded vectors, the method comprising the steps of:
creating, in accordance with an eight binary digit coded vector set, a given uncoded vector having six binary digits for a given eight-bit coded vector of the one or more eight-bit coded vectors, wherein each coded vector in the eight binary digit coded vector set is balanced; and
outputting the given uncoded vector.

20. The method of claim 19, wherein each eight-bit coded vector has two coding binary digits and six uncoded binary digits, the six uncoded binary digits corresponding to a six-bit source vector of a plurality of six-bit source vectors, and wherein the plurality of six-bit source vectors are divided into a plurality of sets of six-bit source vectors for the eight binary digit coded vector set, wherein each eight-bit coded vector corresponds to one of the six-bit source vectors.

21. The method of claim 20, wherein:
a first of the plurality of sets comprises all balanced six-bit source vectors;
a second of the sets comprises all six-bit source vectors with a disparity of plus two with an exception of a six-bit source vector with a trailing run of four ones;
a third of the sets comprises all six-bit source vectors with a disparity of minus two with an exception of a source vector with a trailing run of four zeros; and
a fourth of the sets comprises fourteen six-bit source vectors with a disparity of four or six, two six-bit source vectors with a disparity of two and a trailing run of four, and four control vectors.

22. The method of step 21, wherein the step of creating further comprises the step of not changing the six uncoded binary digits for all eight-bit coded vectors corresponding to the first, second and third sets.

23. The method of claim 21, wherein the first set has coding binary digits of 10 or 01, the second set has coding binary digits of two zeros, the third set has coding binary digits of 11, and the fourth set has coding binary digits of the inverse of the coding binary digits corresponding to the first set.

24. The method of 23, wherein, when the given eight-bit coded vector corresponds to the fourth set, the step of creating further comprises the steps of:
when the six uncoded binary digits of the given coded vector comprise one of 16 unique six-bit uncoded vectors, complementing one to three bits of the six uncoded binary digits in accordance with the eight binary digit coded vector set;
when the six uncoded binary digits of the given coded vector comprise one of four unique control vectors, asserting a control signal; and
for other coded vectors corresponding to the fourth set, dropping the two coding binary digits for the coded vectors.

25. The method of claim 19, further comprising the step of declaring the given eight-bit coded vector as valid if the given eight-bit coded vector is balanced with a run of no more than three at the leading end of the given eight-bit coded vector or of no more than three at the trailing end of the given eight-bit coded vector.

26. The method of claim 21, further comprising the step of activating a control signal when a control vector is created in the step of creating.

27. The method of claim 19, wherein the step of creating further comprises the step of:
determining, by using two binary digits of the given eight-bit coded vector, whether certain binary digits of the given eight-bit coded vector require changing,
wherein the eight binary digit coded vector set is designed so that only one of four possible combinations of the two binary digits indicate that binary digits of an eight-bit coded vector require changing.

28. A decoder for decoding a Direct Current (DC) balanced 6B/8B transmission code from an input data stream that includes one or more eight-bit coded vectors, the decoder adapted:
to create, in accordance with an eight binary digit coded vector set, a given uncoded vector having six binary digits for a given eight-bit coded vector of the one or more eight-bit coded vectors, wherein each coded vector in the eight binary digit coded vector set is balanced; and
to output the given uncoded vector.

29. A semiconductor comprising at least one decoder for decoding a Direct Current (DC) balanced 6B/8B transmission code from an input data stream that includes one or more eight-bit coded vectors, the at least one decoder adapted:

to create, in accordance with an eight binary digit coded vector set, a given uncoded vector having six binary digits for a given eight-bit coded vector of the one or more eight-bit coded vectors, wherein each coded vector in the eight binary digit coded vector set is balanced; and to output the given uncoded vector.

* * * * *

UNITED STATES PATENT AND TRADEMARK OFFICE
CERTIFICATE OF CORRECTION

PATENT NO. : 6,876,315 B1
DATED : April 5, 2005
INVENTOR(S) : Widmer

It is certified that error appears in the above-identified patent and that said Letters Patent is hereby corrected as shown below:

Title page,
Item [57], ABSTRACT,
Line 2, before "format" and after "an" replace "eight-hit" with -- eight-bit --.

Column 7,
Lines 11-12, replace

" $a = A \cdot (\overline{A}B \cdot E \cdot F \cdot C \oplus D + \overline{A} \cdot B \cdot C \cdot D \cdot E \oplus F + \overline{A} \cdot B \cdot C \cdot D \cdot E \cdot F)' +$
$\overline{A} \cdot B' \cdot E' \cdot F' \cdot C \oplus D + \overline{A}' \cdot B' \cdot C' \cdot D' \cdot E \oplus F + \overline{A}' \cdot B' \cdot C' \cdot D' \cdot E' \cdot F'$ "

with

-- $a = A \cdot (\overline{A} \cdot B \cdot E \cdot F \cdot C \oplus D + \overline{A} \cdot B \cdot C \cdot D \cdot E \oplus F + \overline{A} \cdot B \cdot C \cdot D \cdot E \cdot F)' +$
$\overline{A}' \cdot B' \cdot E' \cdot F' \cdot C \oplus D + \overline{A}' \cdot B' \cdot C' \cdot D' \cdot E \oplus F + \overline{A}' \cdot B' \cdot C' \cdot D' \cdot E' \cdot F'$ --

Column 8,
Line 1, replace

" $e = E \cdot (C \cdot D \cdot \overline{E} \cdot F \cdot A \oplus B + A \cdot B \cdot C \cdot D \cdot \overline{E} \cdot F)' + C' \cdot D' \cdot F' \cdot A \oplus B + A' \cdot B' \cdot C' \cdot D' \cdot F'$ "

with

-- $e = E \cdot (C \cdot D \cdot \overline{E} \cdot F \cdot A \oplus B + A \cdot B \cdot C \cdot D \cdot \overline{E} \cdot F)' +$
$C' \cdot D' \cdot \overline{E}' \cdot F' \cdot A \oplus B + A' \cdot B' \cdot C' \cdot D' \cdot \overline{E}' \cdot F'$ --

Column 10,
Line 26, replace

" $e = E \oplus \{(E \oplus \overline{F}') \cdot (C \oplus D' \cdot D \oplus E' \cdot A \oplus B' \cdot B \oplus C')\}$ "

with

-- $e = E \oplus \{(C \oplus D' \cdot D \oplus \overline{E}' \cdot \overline{E} \oplus F') \cdot$
$(A \oplus B + A \oplus B' \cdot B \oplus C')\}$ --

Line 61, replace " $\overline{a} \cdot b' \cdot e \cdot f \cdot g \cdot h' \cdot c \oplus d + \overline{a}$ "

with -- $\overline{a} \cdot b' \cdot e' \cdot f \cdot g \cdot h' \cdot c \oplus d + \overline{a}$ --

UNITED STATES PATENT AND TRADEMARK OFFICE
CERTIFICATE OF CORRECTION

PATENT NO. : 6,876,315 B1
DATED : April 5, 2005
INVENTOR(S) : Widmer

It is certified that error appears in the above-identified patent and that said Letters Patent is hereby corrected as shown below:

Column 11,
Line 8, replace

" $n3 = \bar{a} \bullet b' \bullet c' \bullet d \bullet e \bullet f' \bullet g \bullet h' + \bar{a} \bullet b' \bullet e' \bullet f \bullet g \bullet h' \bullet c \oplus d + \bar{a} \bullet b \bullet c' \bullet d' \bullet d' \bullet g \bullet h' \bullet e \oplus f$ "

with

-- $n3 = \bar{a} \bullet b' \bullet c' \bullet d \bullet e \bullet f' \bullet g \bullet h' + \bar{a} \bullet b' \bullet e' \bullet f \bullet g \bullet h' \bullet c \oplus d + \bar{a} \bullet b \bullet c' \bullet d' \bullet g \bullet h' \bullet e \oplus f$ --

Line 20, replace

" $B - b \bullet (a \bullet \bar{b} \bullet c' \bullet d' \bullet h' \bullet e \oplus f)' + a' \bullet \bar{b}' \bullet c \bullet d \bullet g \bullet h' \bullet e \oplus f$ "

with

-- $B = b \bullet (a \bullet \bar{b} \bullet c' \bullet d' \bullet g \bullet h' \bullet e \oplus f)' + a' \bullet \bar{b}' \bullet c \bullet d \bullet g \bullet h' \bullet e \oplus f$ --.

Line 33, replace

" $C = c \bullet (a' \bullet b' \bullet d' \bullet e \bullet f \bullet g \bullet h)' + a \bullet b \bullet d \bullet e' \bullet f' \bullet g \bullet h'$ "

with

-- $C = c \bullet (a' \bullet b' \bullet d' \bullet e \bullet f \bullet g \bullet h')' + a \bullet b \bullet d \bullet e' \bullet f' \bullet g \bullet h'$ --.

Column 12,
Line 14, before "D132" and after "D116," replace "D1 15," with -- D115, --.

Lines 26-27, replace

" $F = f \bullet (c' \bullet d' \bullet \bar{f} \bullet g \bullet h' \bullet a \oplus b + a \bullet b' \bullet e' \bullet \bar{f} \bullet g \bullet h' \bullet c \oplus d)' + +$
$c \bullet d \bullet e' \bullet \bar{f}' \bullet g \bullet h' \bullet a \oplus b + a' \bullet b \bullet e \bullet \bar{f}' \bullet g \bullet h' \bullet c \oplus d$ "

with

-- $F = f \bullet (c' \bullet d' \bullet e \bullet \bar{f} \bullet g \bullet h' \bullet a \oplus b + a \bullet b' \bullet e' \bullet \bar{f} \bullet g \bullet h' \bullet c \oplus d)' +$
$c \bullet d \bullet e' \bullet \bar{f}' \bullet g \bullet h' \bullet a \oplus b + a' \bullet b \bullet e \bullet \bar{f}' \bullet g \bullet h' \bullet c \oplus d$ --.

UNITED STATES PATENT AND TRADEMARK OFFICE
CERTIFICATE OF CORRECTION

PATENT NO. : 6,876,315 B1
DATED : April 5, 2005
INVENTOR(S) : Widmer

It is certified that error appears in the above-identified patent and that said Letters Patent is hereby corrected as shown below:

Column 12 (cont'd),
Line 33, replace

" $n52 = c' \bullet d' \bullet e \bullet \bar{f} \bullet g \bullet h' \bullet a \oplus b + a \bullet b' \bullet e' \bullet f \bullet gh' \bullet c \oplus d$ "

with $\overline{n52 = c' \bullet d' \bullet e \bullet \bar{f} \bullet g \bullet h' \bullet a \oplus b + a \bullet b' \bullet e' \bullet \bar{f} \bullet g \bullet h' \bullet c \oplus d}$.

Line 68, replace

" $n64 = g \bullet h \bullet e \oplus f + e' \bullet f' \bullet g \oplus h$ "

with $\overline{n64 = g' \bullet h' \bullet e \oplus f + e' \bullet f' \bullet g \oplus h}$.

Column 13,
Lines 28-29, replace

" $A = a \oplus \{(e \oplus f \bullet g \bullet h) \bullet (\bar{a} \oplus b \bullet b \oplus c' \bullet c \oplus d \bullet d \oplus e' + \bar{a} \oplus b \bullet b \oplus e' \bullet c \oplus d +$
$\bar{a} \oplus b' \bullet b \oplus c \bullet c \oplus d')\}$ "

with $\overline{A = a \oplus \{(e \oplus f \bullet g \bullet h') \bullet (\bar{a} \oplus b \bullet b \oplus c' \bullet c \oplus d \bullet d \oplus e' + \bar{a} \oplus b \bullet b \oplus e' \bullet c \oplus d +}$
$\overline{\bar{a} \oplus b' \bullet b \oplus c \bullet c \oplus d')\}}$.

Line 34, replace

" $D = d \oplus (a \oplus b \bullet b \oplus c'c \oplus \bar{d} \bullet \bar{d} \oplus e' \bullet e \oplus f \bullet g \bullet h')$ "

with $\overline{D = d \oplus (a \oplus b \bullet b \oplus c' \bullet c \oplus \bar{d} \bullet \bar{d} \oplus e' \bullet e \oplus f \bullet g \bullet h')}$.

UNITED STATES PATENT AND TRADEMARK OFFICE
CERTIFICATE OF CORRECTION

PATENT NO. : 6,876,315 B1
DATED : April 5, 2005
INVENTOR(S) : Widmer

It is certified that error appears in the above-identified patent and that said Letters Patent is hereby corrected as shown below:

Column 13 (cont'd),
Line 42, replace

" $(a \oplus b \bullet c \oplus d' + a \oplus b' \bullet c \oplus d) \bullet (e \oplus f \bullet g \bullet h' + e \oplus f'$ "

with

-- $(a \oplus b \bullet c \oplus d' + a \oplus b' \bullet c \oplus d) \bullet (e \oplus f \bullet g \oplus h' + e \oplus f'$ --.

Line 51, after "e.g.," replace "2xfNV" with -- 2xINV --.

Signed and Sealed this

Thirteenth Day of September, 2005

JON W. DUDAS
*Director of the United States Patent and Trademark Office*